US011953740B2

(12) United States Patent
Weng et al.

(10) Patent No.: US 11,953,740 B2
(45) Date of Patent: Apr. 9, 2024

(54) PACKAGE STRUCTURE

(71) Applicant: Taiwan Semiconductor Manufacturing Company, Ltd., Hsinchu (TW)

(72) Inventors: Chung-Ming Weng, Hsinchu (TW); Chen-Hua Yu, Hsinchu (TW); Chung-Shi Liu, Hsinchu (TW); Hao-Yi Tsai, Hsinchu (TW); Cheng-Chieh Hsieh, Tainan (TW); Hung-Yi Kuo, Taipei (TW); Tsung-Yuan Yu, Taipei (TW); Hua-Kuei Lin, Hsinchu (TW); Che-Hsiang Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 307 days.

(21) Appl. No.: 17/320,228

(22) Filed: May 14, 2021

(65) Prior Publication Data
US 2022/0365297 A1 Nov. 17, 2022

(51) Int. Cl.
*G02B 6/42* (2006.01)
*H01L 23/00* (2006.01)

(52) U.S. Cl.
CPC ......... *G02B 6/4243* (2013.01); *G02B 6/4214* (2013.01); *G02B 6/4239* (2013.01); *G02B 6/4251* (2013.01); *H01L 24/19* (2013.01); *H01L 24/20* (2013.01)

(58) Field of Classification Search
CPC .. G02B 6/4214; G02B 6/4239; G02B 6/4243; G02B 6/4251
See application file for complete search history.

(56) References Cited

U.S. PATENT DOCUMENTS

| 7,136,594 | B2 * | 11/2006 | Nakanishi | G02B 6/4201 |
| | | | | 398/164 |
| 8,724,937 | B2 * | 5/2014 | Barwicz | G02B 6/30 |
| | | | | 385/14 |
| 10,001,611 | B2 * | 6/2018 | Ding | H01L 23/48 |
| 10,930,628 | B2 * | 2/2021 | Chang | H01L 25/167 |
| 2017/0123173 | A1 * | 5/2017 | Ji | G02B 6/12004 |
| 2020/0006088 | A1 * | 1/2020 | Yu | H01L 23/5386 |

* cited by examiner

*Primary Examiner* — Daniel Petkovsek
(74) *Attorney, Agent, or Firm* — JCIPRNET

(57) ABSTRACT

A package structure including a photonic, an electronic die, an encapsulant and a waveguide is provided. The photonic die includes an optical coupler. The electronic die is electrically coupled to the photonic die. The encapsulant laterally encapsulates the photonic die and the electronic die. The waveguide is disposed over the encapsulant and includes an upper surface facing away from the encapsulant. The waveguide includes a first end portion and a second end portion, the first end portion is optically coupled to the optical coupler, and the second end portion has a groove on the upper surface.

20 Claims, 24 Drawing Sheets

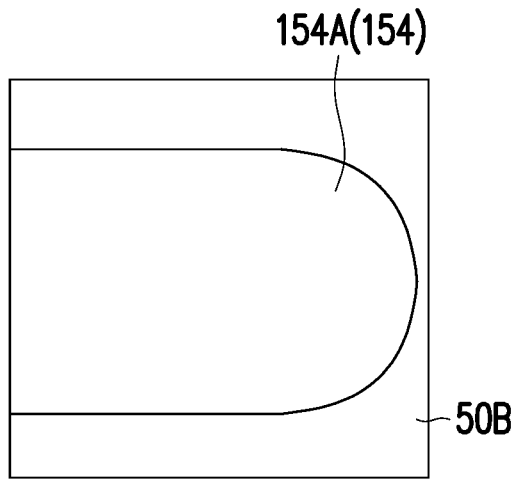 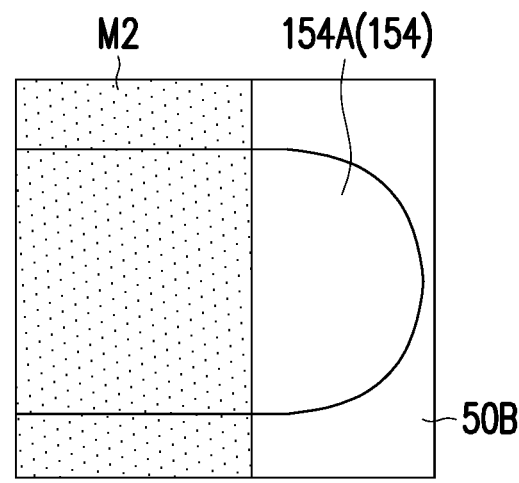
FIG. 24A  FIG. 24B
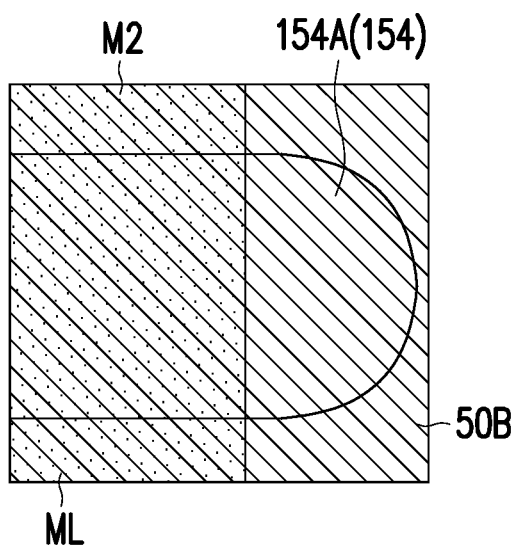 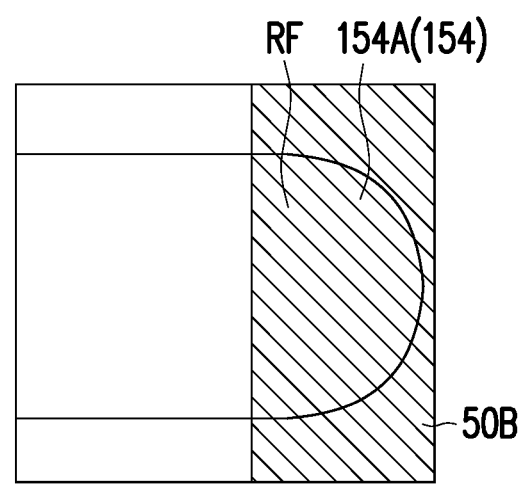
FIG. 24C  FIG. 24D

PACKAGE STRUCTURE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 24A to 24D illustrate cross-sectional views of intermediate steps during a process for forming a waveguide in accordance with some embodiments.

DETAILED DESCRIPTION

Figure 1:
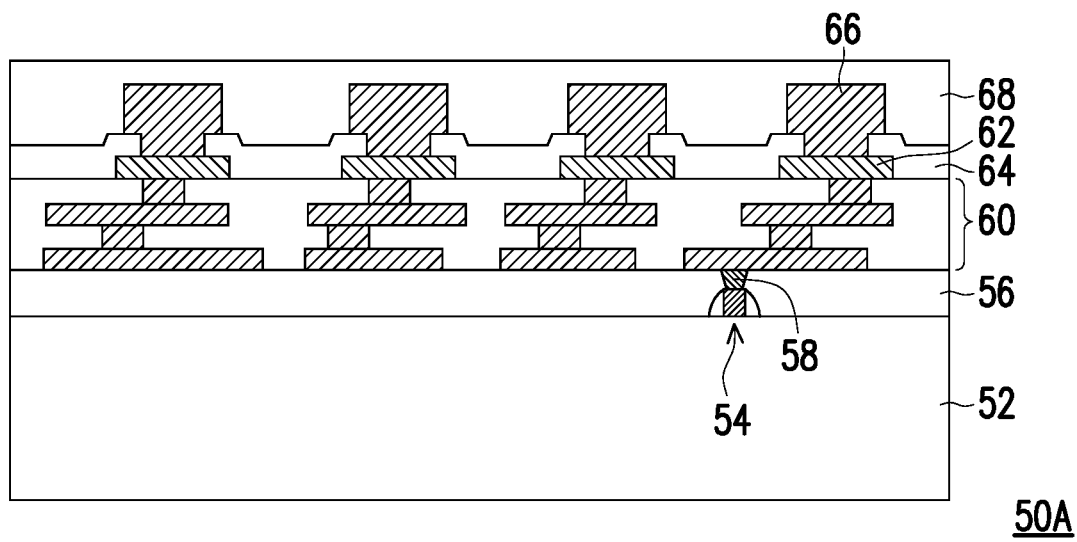
FIG. 1 illustrates a cross-sectional view of an electronic die in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of an electronic die 50A in accordance with some embodiments. The electronic die 50A will be packaged in subsequent processing to form an integrated circuit package. The electronic die 50A may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The electronic die 50A may be formed in a wafer, which may include different device regions that are singulated in subsequent steps to form a plurality of integrated circuit dies. The electronic die 50A may be processed according to applicable manufacturing processes to form integrated circuits. For example, the electronic die 50A includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, inductors, the like, or combinations thereof. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, and may be formed using spin coating, lamination, atomic layer deposition (ALD), chemical vapor deposition (CVD), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and the conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. In some embodiments, interconnect structure 60 may be formed of alternating layers of dielectric (e.g. low-k dielectric material) and conductive material (e.g., copper) with vias interconnecting the layers of conductive material and may be formed through any suitable process (such as deposition, damascene, dual damascene, or the like). The metallization patterns of the interconnect structure 60 are electrically coupled to the devices 54 by the conductive plugs 58.

The electronic die 50A further includes pads 62, such as aluminum pads, to which external connections are made. The pads 62 are on the active side of the electronic die 50A, such as in and/or on the interconnect structure 60. One or more passivation layers 64 are on the electronic die 50A, such as on portions of the interconnect structure 60 and the pads 62. Openings extend through the passivation layers 64 to the pads 62. Die connectors 66, such as conductive pillars (for example, formed of a metal such as copper), extend through the openings in the passivation layers 64 and are physically and electrically coupled to respective ones of the pads 62. The die connectors 66 may be formed by, for example, plating, or the like. The die connectors 66 are electrically coupled to the respective integrated circuits of the electronic die 50A.

Optionally, solder regions (e.g., solder balls or solder bumps) may be disposed on the die connectors 66. The solder balls may be used to perform chip probe (CP) testing on the electronic die 50A. The CP testing may be performed on the electronic die 50A to ascertain whether the electronic die 50A is a known good die (KGD). Thus, only electronic dies 50A, which are KGDs, undergo subsequent processing and are packaged, and dies, which fail the CP testing, are not packaged. After the CP testing, the solder regions may be removed in subsequent processing steps.

An insulating layer 68 may (or may not) be on the active side of the electronic die 50A, such as on the passivation layers 64 and the die connectors 66. The insulating layer 68 laterally encapsulates the die connectors 66, and the insulating layer 68 is laterally coterminous with the electronic die 50A. Initially, the insulating layer 68 may bury the die connectors 66, such that the topmost surface of the insulating layer 68 is above the topmost surfaces of the die connectors 66. In some embodiments where solder regions are disposed on the die connectors 66, the insulating layer 68 may bury the solder regions as well. Alternatively, the solder regions may be removed prior to forming the insulating layer 68.

The insulating layer 68 may be a polymer such as polybenzoxazole (PBO), polyimide, benzocyclobutene (BCB), or the like; a nitride such as silicon nitride or the like; an oxide such as silicon oxide, PSG, BSG, BPSG, or the like; the like, or a combination thereof. The insulating layer 68 may be formed, for example, by spin coating, lamination, ALD, CVD, or the like. In some embodiments, the die connectors 66 are exposed through the insulating layer 68 during formation of the electronic die 50A. In some embodiments, the die connectors 66 remain buried and are exposed during a subsequent process for packaging the electronic die 50A. Exposing the die connectors 66 may remove any solder regions that may be present on the die connectors 66.

In some embodiments, the electronic die 50A is a stacked device that include multiple semiconductor substrates 52. For example, the electronic die 50A may be a memory device such as a hybrid memory cube (HMC) module, a high bandwidth memory (HBM) module, or the like that includes multiple memory dies. In such embodiments, the electronic die 50A includes multiple semiconductor substrates 52 interconnected by through-substrate vias (TSVs). Each of the semiconductor substrates 52 may (or may not) have an interconnect structure 60.

Figure 2:
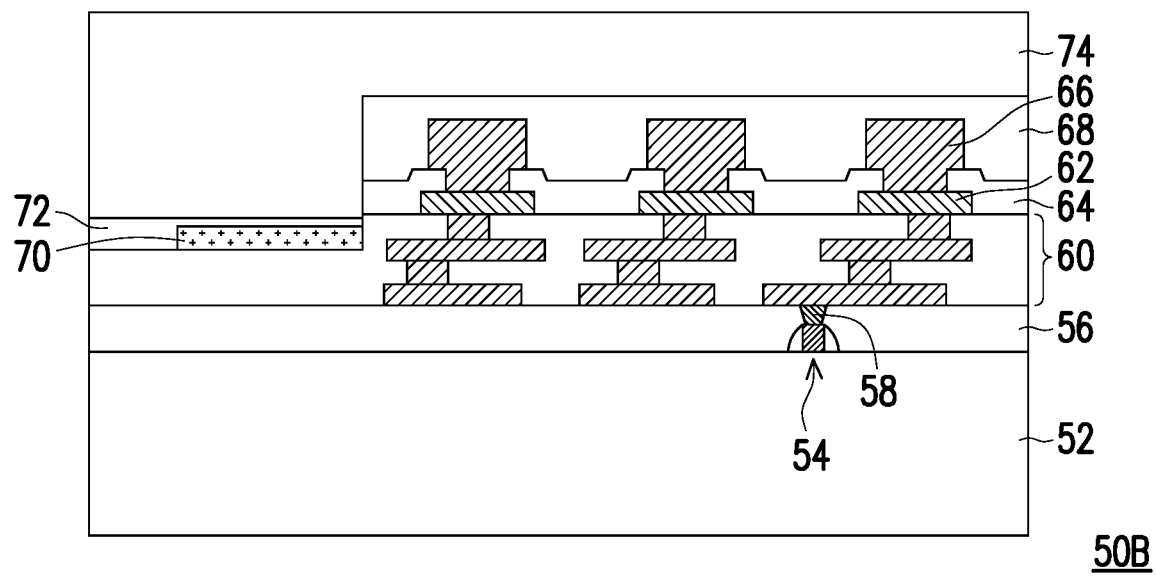
FIG. 2 illustrates a cross-sectional view of a photonic die in accordance with some embodiments.

FIG. 2 illustrates a cross-sectional view of a photonic die 50B in accordance with some embodiments. The photonic die 50B will be packaged in subsequent processing to form an integrated circuit package. The photonic die 50B may be a photonic integrated circuit (PIC) die. In some embodiments, the photonic die 50B is similar to the electronic die 50A (see FIG. 1), with similar features being labeled with similar numerical references, and descriptions of the similar features are not repeated herein. In some embodiments, the photonic die 50B may be formed using the process steps described above with reference to FIG. 1 and the description is not repeated herein.

In some embodiments, the photonic die 50B comprises an optical coupling structure that is configured to be coupled to a fiber. In some embodiments, the optical coupling structure comprises an optical coupler 70, which is coupled to the interconnect structure 60. In some embodiments, the optical coupler 70 comprises a layer of silicon formed over a layer of silicon oxide. In some embodiments, the passivation layers 64 and the insulating layer 68 are patterned to expose the interconnect structure 60 before forming to the optical coupler 70. In other embodiments, the passivation layers 64 and the insulating layer 68 are formed and patterned after forming the optical coupler 70. The patterning process may comprise suitable photolithography and etch methods. After forming the optical coupler 70, an insulating layer 72 is formed over the optical coupler 70 and the exposed portion of the interconnect structure 60. In some embodiments, the insulating layer 72 comprises a dielectric material, such as silicon oxide, or the like. Subsequently, a sacrificial layer 74 is formed over the insulating layers 68 and 72. In some embodiments, the sacrificial layer 74 comprises polyimide, polyolefin, a combination thereof, or the like and may be formed using spin coating, or the like.

FIGS. 3-13 illustrate cross-sectional views of intermediate steps during a process for forming a package in accordance with some embodiments. A package region 101 of a package component 100 is illustrated. In some embodiments, the package component 100 comprises a plurality of package regions, and one or more of the integrated circuit dies are packaged to form an integrated circuit package in each of the package regions. The integrated circuit packages may also be referred to as integrated fan-out (InFO) packages.

Figure 3:
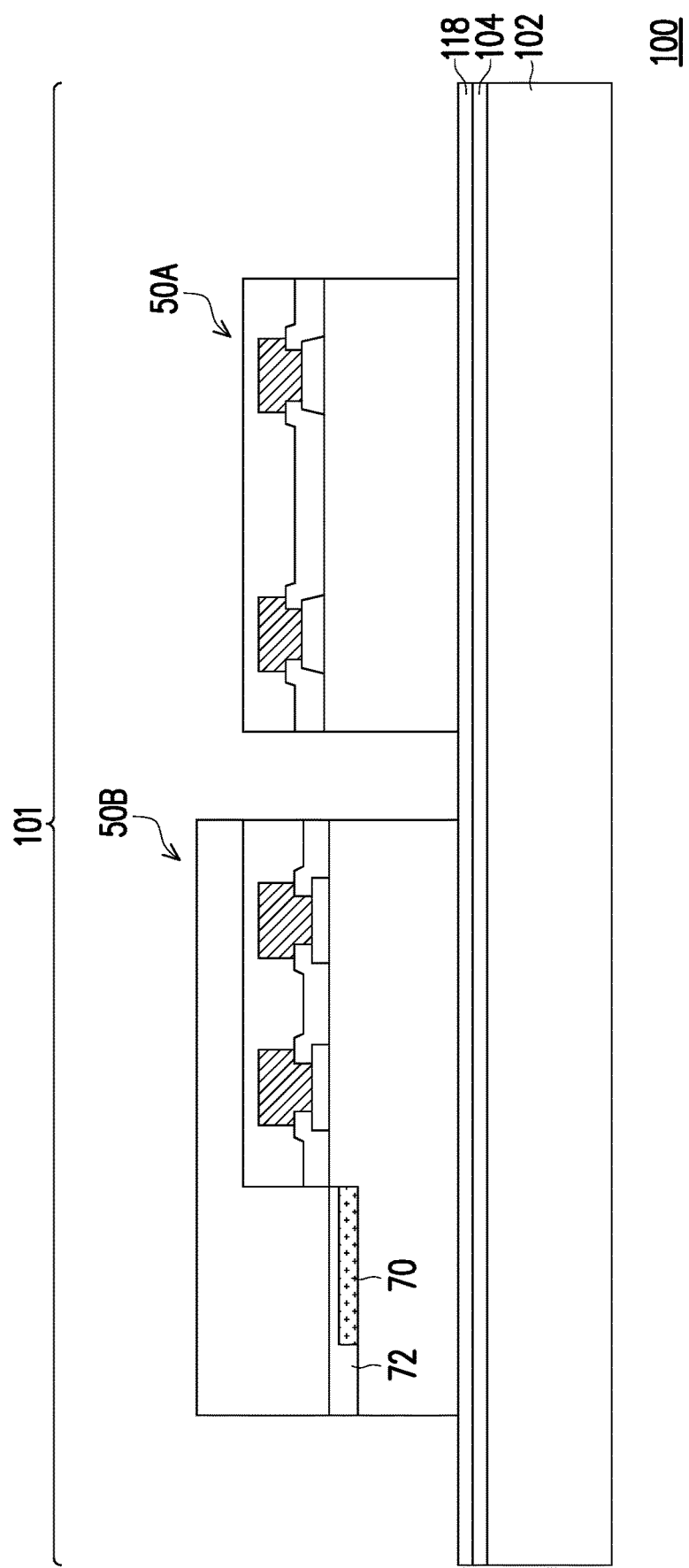
FIGS. 3 to 13 illustrate cross-sectional views of intermediate steps during a process for forming a package in accordance with some embodiments.

In FIG. 3, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

The electronic die 50A (see FIG. 1) and the photonic die 50B (see FIG. 2) are adhered to the carrier substrate 102 by an adhesive layer 118 formed over the release layer 104. The adhesive layer 118 may comprise any suitable adhesive, epoxy, die attach film (DAF), or the like.

Figure 4:
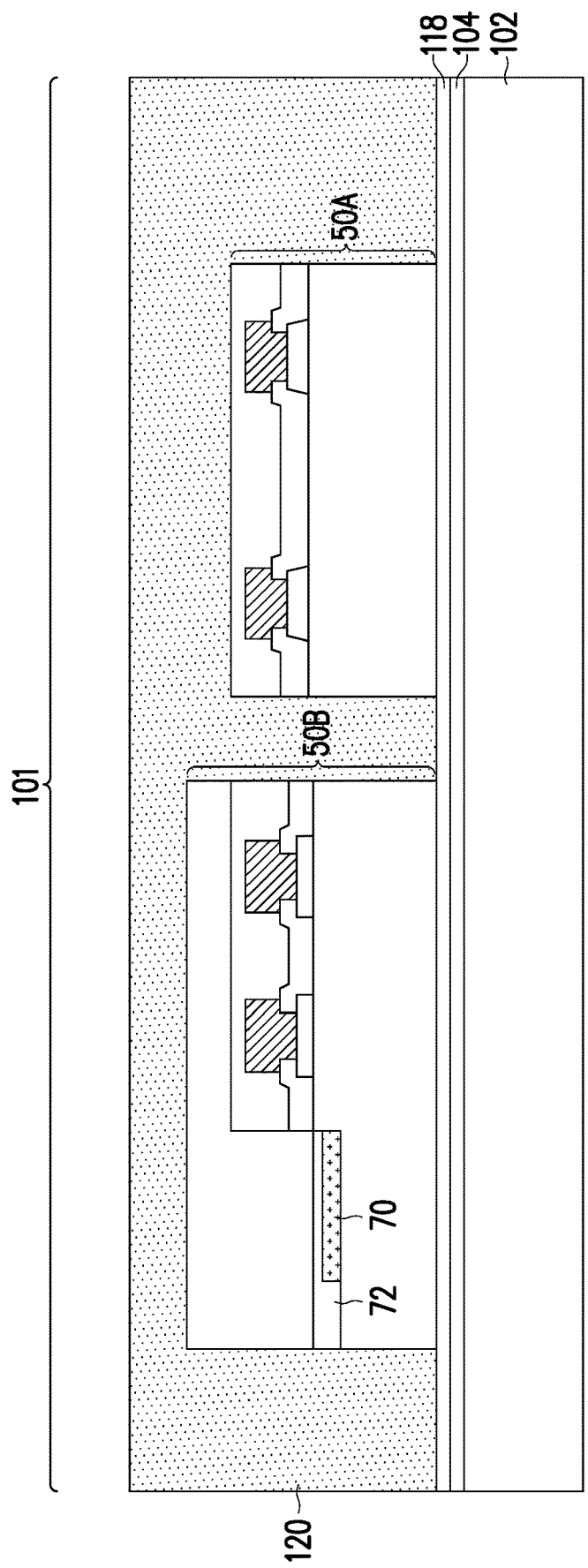

In FIG. 4, an encapsulant 120 is formed on and around the electronic die 50A and the photonic die 50B. The encapsulant 120 laterally encapsulates the photonic die 50B and the electronic die 50A. The encapsulant 120 may be a molding compound, epoxy, or the like. The encapsulant 120 may be applied by compression molding, transfer molding, or the like, and may be formed over the carrier substrate 102 such that the electronic die 50A and the photonic die 50B are buried or covered. The encapsulant 120 is further formed in gap regions between the electronic die 50A and the photonic die 50B. The encapsulant 120 may be applied in liquid or semi-liquid form and then subsequently cured.

Figure 5:
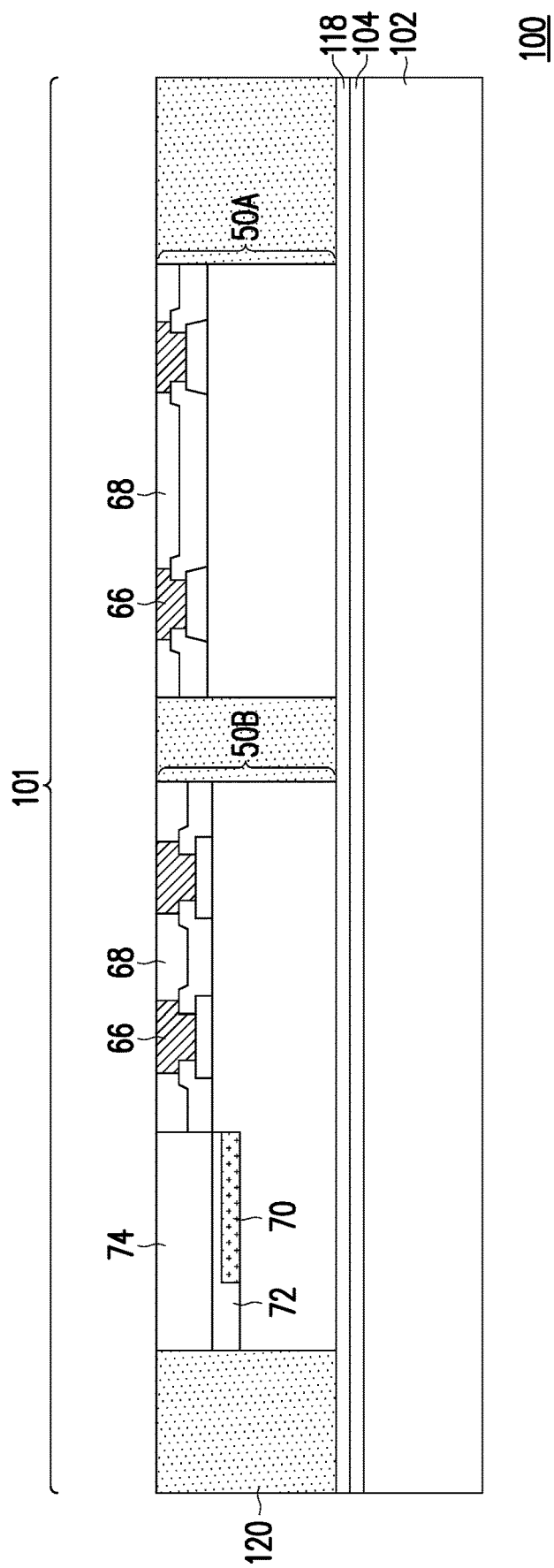

In FIG. 5, a planarization process is performed on the encapsulant 120 to expose the die connectors 66. The planarization process may also remove portions of the insulating layers 68, the sacrificial layer 74, and/or the die connectors 66 until the die connectors 66 are exposed. Top surfaces of the die connectors 66, the insulating layers 68, the sacrificial layer 74, and the encapsulant 120 are substantially coplanar after the planarization process within process variations. The planarization process may be, for example, a chemical-mechanical polish (CMP), a grinding process, or the like. In some embodiments, the planarization may be omitted, for example, if the die connectors 66 are already exposed.

Figure 6:
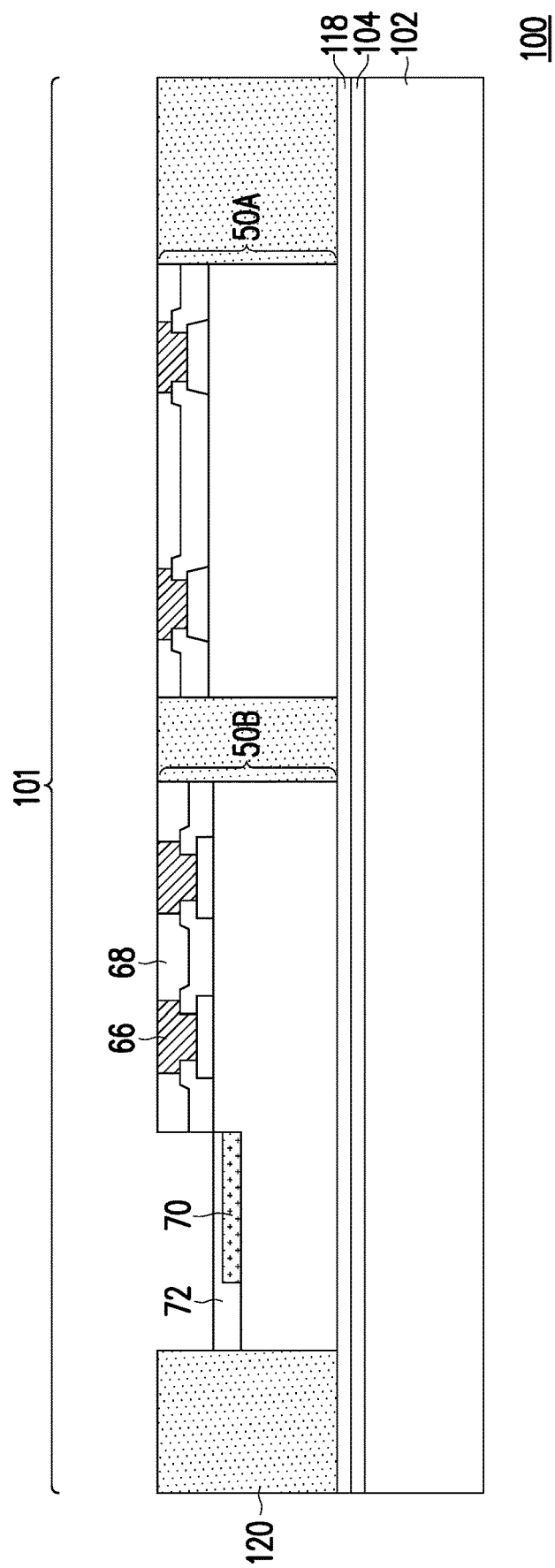

In FIG. 6, a remaining portion of the sacrificial layer 74 (see FIG. 5) is removed to expose the optical coupler 70 and the insulating layer 72. In some embodiments, the remaining portion of the sacrificial layer 74 may be removed by a suitable selective etch process. The selective etch process may comprise one or more suitable wet etch processes, one or more suitable dry etch processes, combinations thereof, or the like. In some embodiments, the wet etch processes may be performed using suitable strippers. In some embodiments, the dry etch processes may be performed using gasses, such as O2, Ar, a combination thereof, or the like.

Figure 7:
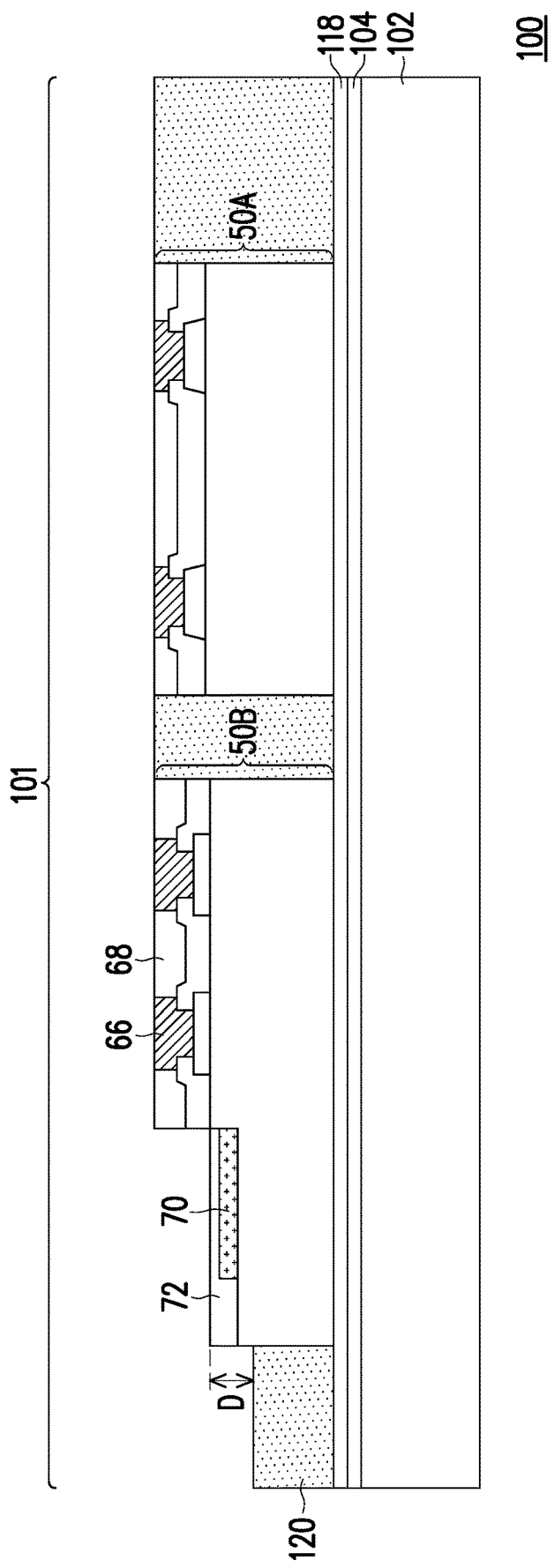

In FIG. 7, a portion of the encapsulant 120 adjacent to the insulating layer 72 is recessed below a top surface of the insulating layer 72. In some embodiments, portion of the encapsulant 120 is recessed below a top surface of the optical coupler 70. The recessing process may comprise suitable photolithography and etch processes. The suitable etch process may comprise a dry etch process or a wet etch process. The encapsulant 120 is recessed below the top surface of the insulating layer 72 to a depth D. The depth D may be between about 0.1 µm and about 100 µm.

Figure 8:
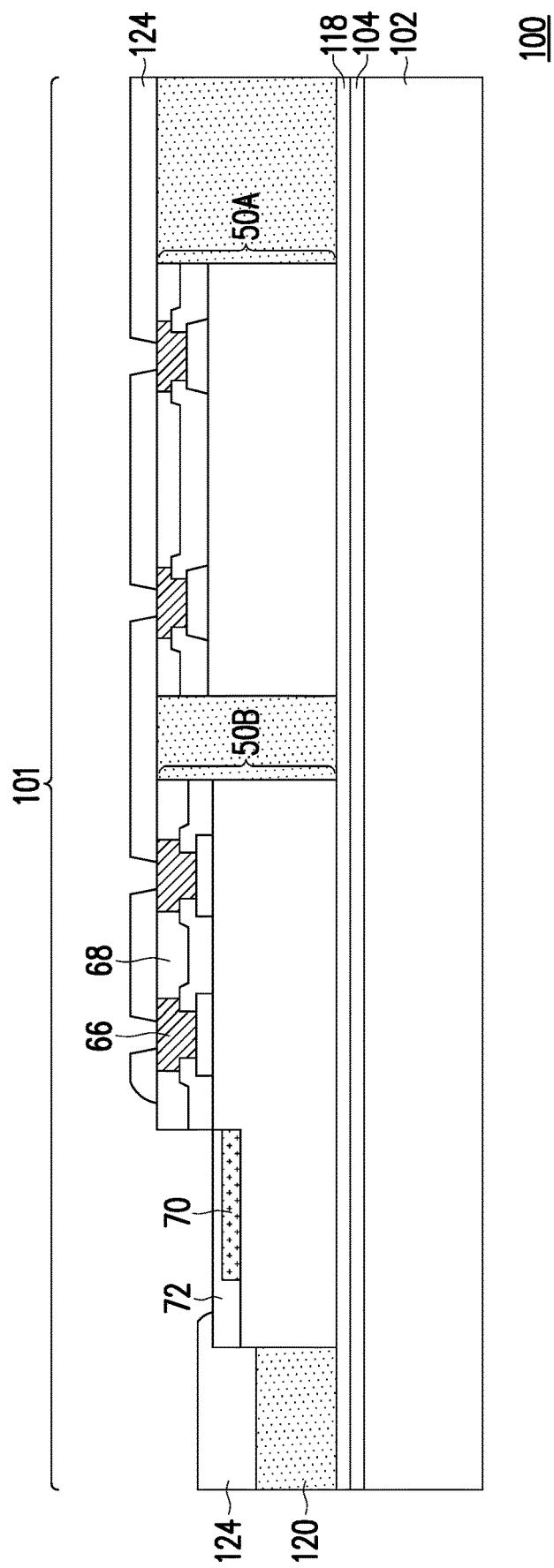

In FIG. 8, a dielectric layer 124 (base dielectric layer) is deposited on the encapsulant 120, die connectors 66 and the insulating layers 68 and 72. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings in the dielectric layer 124 exposing portions of the die connectors 66 and a portion of the insulating layer 72. The patterning may be performed by an acceptable process, such as by exposing and developing the dielectric layer 124 to light when the dielectric layer 124 is a photo-sensitive material or by etching using, for example, an anisotropic etch when the dielectric layer 124 is a non-photo-sensitive material.

Figure 9:
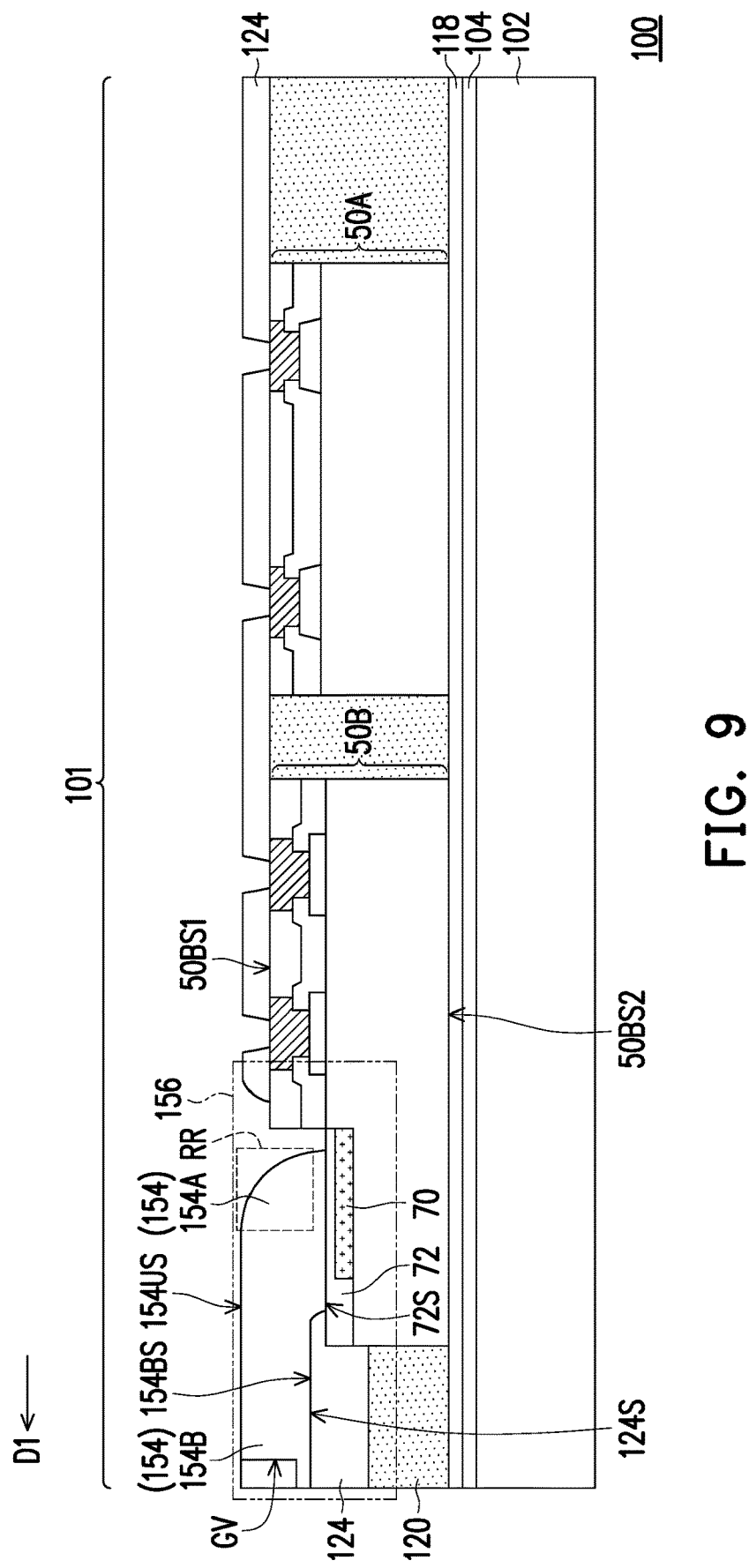
Figure 14:
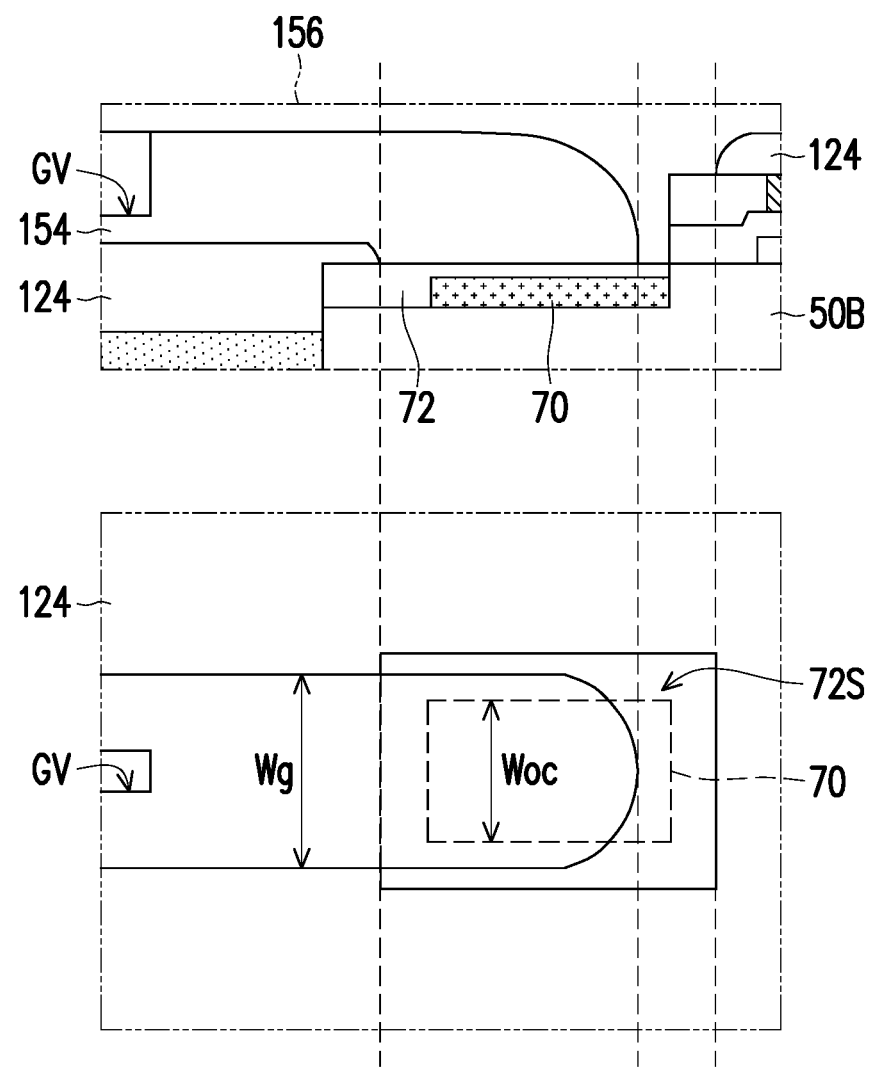
FIG. 14 illustrates cross-sectional and top views of a region of the package region in FIG. 9 in accordance with some embodiments.

In FIG. 9, a waveguide (optical waveguide) 154 is formed over the insulating layer 72 and the optical coupler 70. In some embodiments, the waveguide 154 comprises an organic polymer. In some embodiments, the waveguide 154 comprises polyimide, polyolefin, polybenzoxazole (PBO), benzocyclobutene (BCB), polynorbornene, acrylate, epoxy, siloxane, a combination thereof, or the like. In some other embodiments, the waveguide 154 may comprise silicon or silicon nitride. FIG. 14 illustrates cross-sectional and plan views of a region 156 of the package region 101 illustrated in FIG. 9. Referring to FIGS. 9 and 14, the waveguide 154 is formed in the opening of the dielectric layer 124 exposing the top surface 72S of the insulating layer 72.

In some embodiments, the waveguide 154 comprises a first end portion 154A and a second end portion 154B. The first end portion 154A may be disposed on the insulating layer 72 and optically coupled to the optical coupler 70. The waveguide 154 may extend from the first end portion 154A along a top surface 72S of the insulating layer 72. The second end portion 154B may be disposed on the dielectric layer 124 and over the encapsulant 120. The waveguide 154 may extend from the second end portion 154B along a top surface 124S of the dielectric layer 124. In an aspect, the second end portion 154B extends away from the first end portion 154A. A portion of the dielectric layer 124 (base dielectric layer) may be disposed between the waveguide 154 and the encapsulant 120, such that the leakage of light may be reduced.

The waveguide 154 may comprise an upper surface 154US facing away from the encapsulant 120 and a bottom surface 154BS facing the encapsulant 120. In FIG. 9, the bottom surface 154BS of the waveguide 154 directly contacts the top surface 124S of the dielectric layer 124 and the top surface 72S of the insulating layer 72. The photonic die 50B comprises a top surface 50BS1 facing away from the carrier substrate 102 and the bottom surface 50BS2 facing the carrier substrate 102. The top surface 50BS1 of the photonic die 50B comprises the top surfaces of the die connectors 66 and the insulating layers 68. In FIG. 9, the top surface 50BS1 of the photonic die 50B is disposed between the upper surface 154US of the waveguide 154 and a bottom surface 50BS2 of the photonic die 50B. In another aspect, the level high of the upper surface 154US of the waveguide 154 is higher than the level high of the top surface 50BS1 of the photonic die 50B, and the level high of the top surface 50BS1 of the photonic die 50B is higher than the level high of the bottom surface 50BS2 of the photonic die 50B. In other words, the waveguide 154 may not be considered as a component of the photonic die 50B.

In some embodiments, the organic polymer material of the waveguide 154 may be deposited in the opening of the dielectric layer 124 exposing the insulating layer 72. The organic polymer material of the waveguide 154 may be deposited using spin coating, or the like. Subsequently, the organic polymer material may be patterned using suitable photolithography processes, as described in further detail below.

The first end portion 154A may comprise a reflective region RR on the upper surface 154US. In some embodiments, the reflective region RR comprises an arc-shaped surface. For example, a cross-section of the reflective region RR may present an arc-shaped profile, as shown in FIG. 9. The second end portion 154B may have at least one groove GV on the upper surface 154US. The groove GV may extend along a first direction (length direction) D1 from the first end portion 154A to the second end portion 154B. In some embodiments, the groove GV may be adapted for accommodating a fiber. Further in FIGS. 9 and 14, In some embodiments, a width of the optical coupler 70 is less than a width of the waveguide 154.

Figure 10:
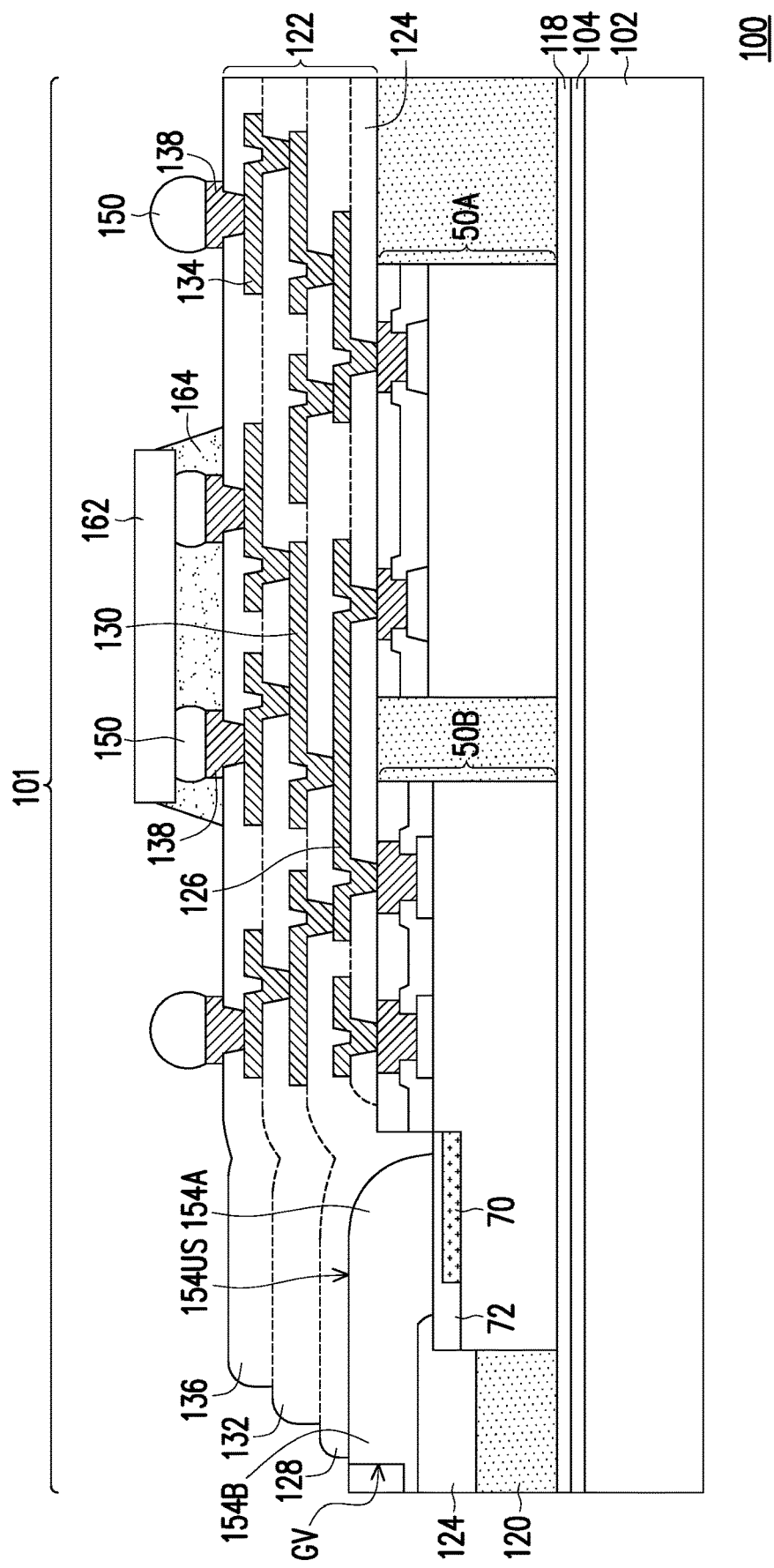

In FIG. 10, a redistribution structure 122 is formed over the encapsulant 120, the electronic die 50A, the photonic die 50B, and the waveguide 154. The redistribution structure 122 includes dielectric layers 124, 128, 132, and 136; and metallization patterns 126, 130, and 134. The metallization patterns may also be referred to as redistribution layers or redistribution lines. The redistribution structure 122 is shown as an example having three layers of metallization patterns. More or fewer dielectric layers and metallization patterns may be formed in the redistribution structure 122. If fewer dielectric layers and metallization patterns are to be formed, steps and process discussed below may be omitted. If more dielectric layers and metallization patterns are to be formed, steps and processes discussed below may be repeated.

The metallization pattern 126 is formed. The metallization pattern 126 includes conductive elements extending along the major surface of the dielectric layer 124 and extending through the dielectric layer 124 to physically and electrically couple to the electronic die 50A and the photonic die 50B. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating, electroless plating, or the like. The conductive material may comprise a metal, such as copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

After forming the metallization pattern 126, the dielectric layer 128 (first dielectric layer) is deposited on the metallization pattern 126, the dielectric layer 124 and the waveguide 154. The dielectric layer 128 may be formed in a manner similar to the dielectric layer 124, and may be formed of a similar material as the dielectric layer 124. In some embodiments, the dielectric layer 128 is disposed on the waveguide 154. Specifically, the dielectric layer 128 is disposed on and covers a portion of the upper surface 154US of the waveguide 154. In FIG. 10, a portion of the groove GV is uncovered by the dielectric layer 128. In some embodiments, during the formation of the dielectric layer 128, the dielectric layer 128 may be patterned to expose at least a portion of the groove GV. In some embodiments, the dielectric layer 128 is laterally interposed between the waveguide 154 and the dielectric layer 124.

The metallization pattern 130 is then formed. The metallization pattern 130 includes portions on and extending along the major surface of the dielectric layer 128. The metallization pattern 130 further includes portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

After forming the metallization pattern 130, the dielectric layer 132 is deposited on the metallization pattern 130 and the dielectric layer 128. The dielectric layer 132 may be formed in a manner similar to the dielectric layer 124, and may be formed of a similar material as the dielectric layer 124. Similar to the dielectric layer 128, a portion of the groove GV is uncovered by the dielectric layer 132. In some embodiments, during the formation of the dielectric layer 132, the dielectric layer 132 may be patterned to expose at least a portion of the groove GV.

The metallization pattern 134 is then formed. The metallization pattern 134 includes portions on and extending along the major surface of the dielectric layer 132. The metallization pattern 134 further includes portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the redistribution structure 122. As such, all of the intermediate metallization patterns of the redistribution structure 122 (e.g., the metallization patterns 126 and 130) are disposed between the metallization pattern 134 and the electronic die 50A and the photonic die 50B. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

After forming the metallization pattern 134, the dielectric layer 136 is deposited on the metallization pattern 134 and dielectric layer 132. The dielectric layer 136 may be formed in a manner similar to the dielectric layer 124, and may be formed of the same material as the dielectric layer 124. The dielectric layer 136 is the topmost dielectric layer of the redistribution structure 122. As such, all of the metallization patterns of the redistribution structure 122 (e.g., the metallization patterns 126, 130, and 134) are disposed between the dielectric layer 136 and the electronic die 50A and the photonic die 50B. The redistribution structure 122 may be also referred to as a front-side redistribution structure. Similar to the dielectric layer 128, a portion of the groove GV is uncovered by the dielectric layer 136. In some embodiments, during the formation of the dielectric layer 136, the dielectric layer 136 may be patterned to expose at least a portion of the groove GV.

Further in FIG. 10, after forming redistribution structure 122, under-bump metallizations (UBMs) 138 are formed for external connection to the redistribution structure 122. The UBMs 138 have bump portions on and extending along the major surface of the dielectric layer 136, and have via portions extending through the dielectric layer 136 to physically and electrically couple the metallization pattern 134. As a result, the UBMs 138 are electrically coupled to the electronic die 50A and the photonic die 50B through the redistribution structure 122. The UBMs 138 may be formed of the same material as the metallization pattern 126. In some embodiments, the UBMs 138 has a different size than the metallization patterns 126, 130, and 134.

After forming the UBMs 138, conductive connectors 150 are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, other device 162, such as transimpedance amplifier (TIA) chips, may be attached to the package region 101 (e.g., to the UBMs 138). For example, the device 162 may be flip chip bonded to the conductive connectors 150. An underfill 164 may be formed between the device 162 and the redistribution structure 122. The underfill 164 may comprise, for example, a liquid epoxy or other protective material, and may be formed by a capillary flow process after the device 162 is attached to the redistribution structure 122. The electronic die 50A may be electrically coupled to the photonic die 50B through the redistribution structure 122 and the device 162.

Figure 11:
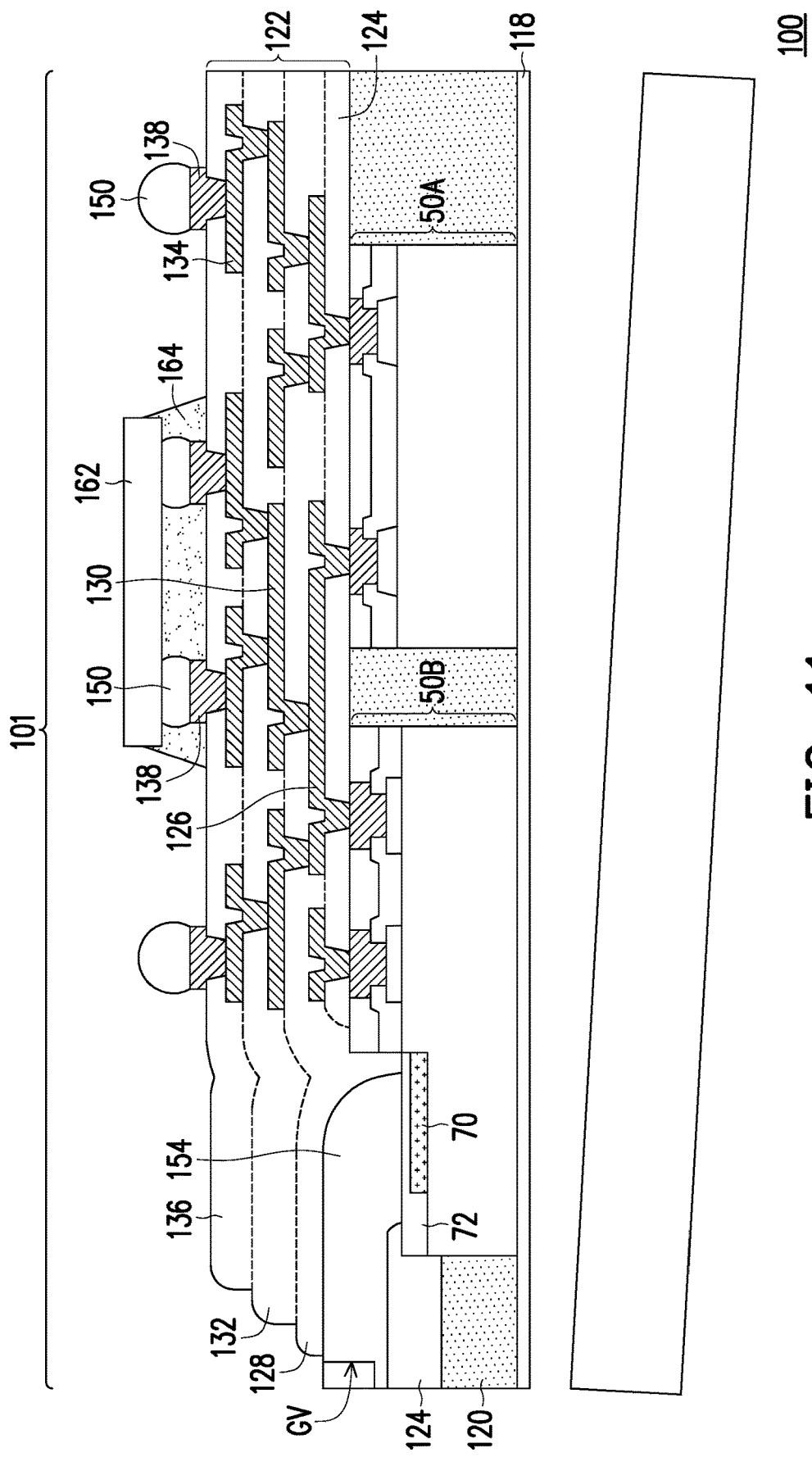

In FIG. 11, a carrier substrate de-bonding is performed to detach (or "de-bond") the carrier substrate 102 from the package component 100. In some embodiments, the de-bonding includes projecting a light such as a laser light or an UV light on the release layer 104 so that the release layer 104 decomposes under the heat of the light and the carrier substrate 102 can be removed.

Figure 12:
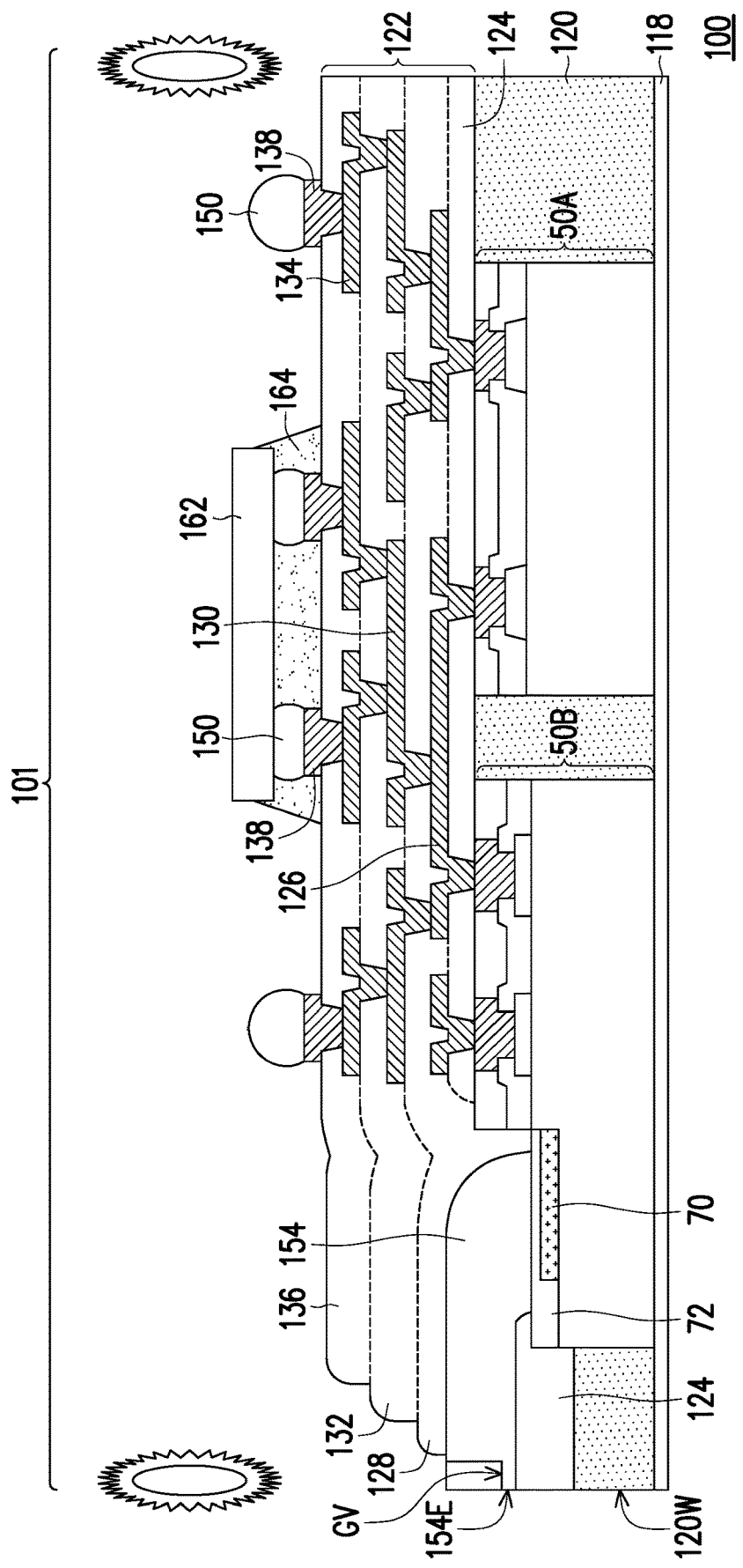

In FIG. 12, after de-bonding the carrier substrate 102, a singulation process is performed by sawing along scribe line regions, e.g., between adjacent package regions of the package component 100. The sawing singulates the package region 101 from the rest of the package component 100 and forms a package 101. After the singulation process, the edge 154E of the second end portion 154B of the waveguide 154 may be vertically aligned with a sidewall 120W of the encapsulant 120 after the singulation process. As shown in FIG. 12, each of the dielectric layer 128, the dielectric layer 132, and the dielectric layer 136 is laterally distanced from the edge 154E of the second end portion 154B.

Figure 13:
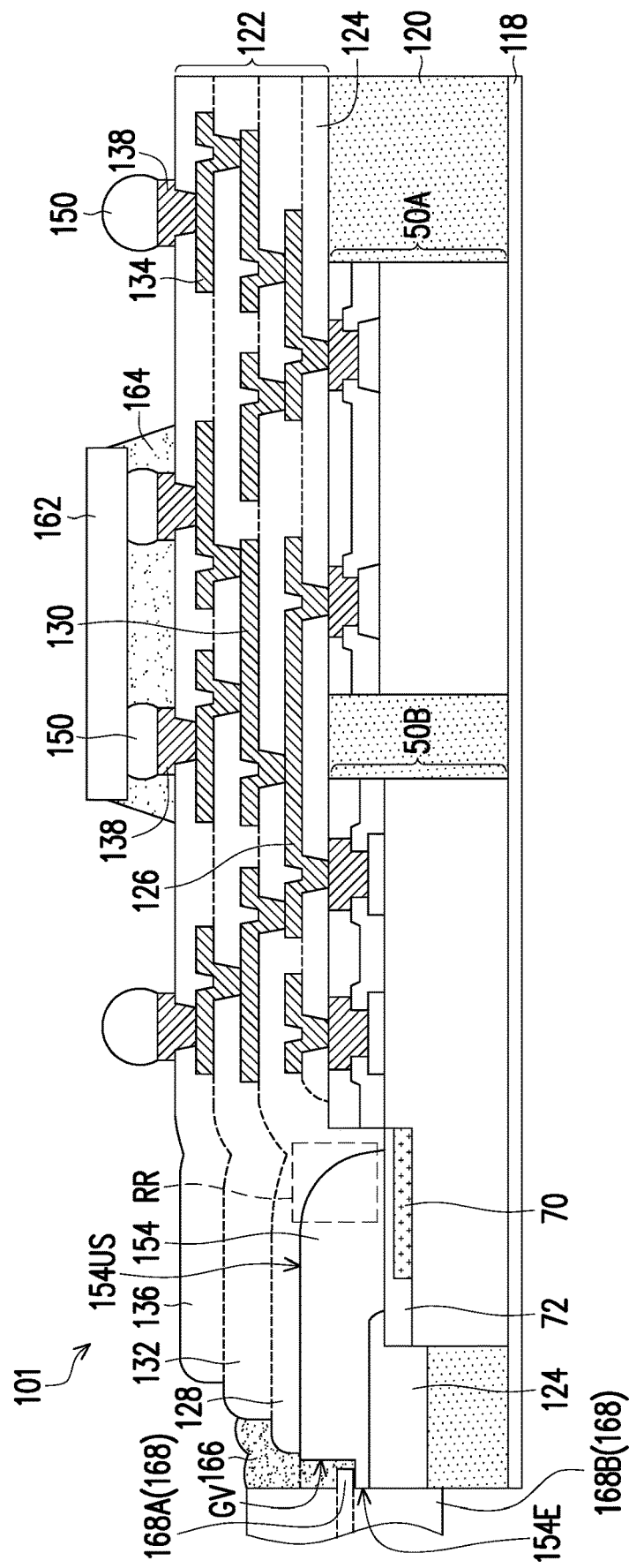
Figure 15A:
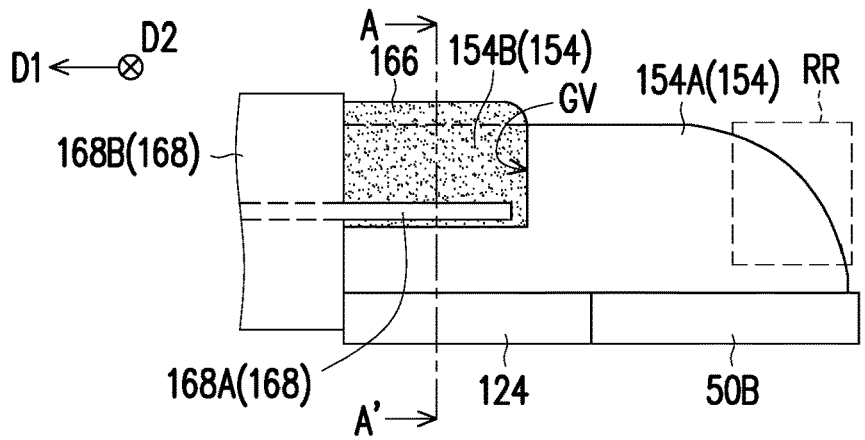
FIGS. 15A and 15B schematically illustrate cross-sectional and top views of the waveguide and the fiber in FIG. 13 in accordance with some embodiments.
Figure 15B:
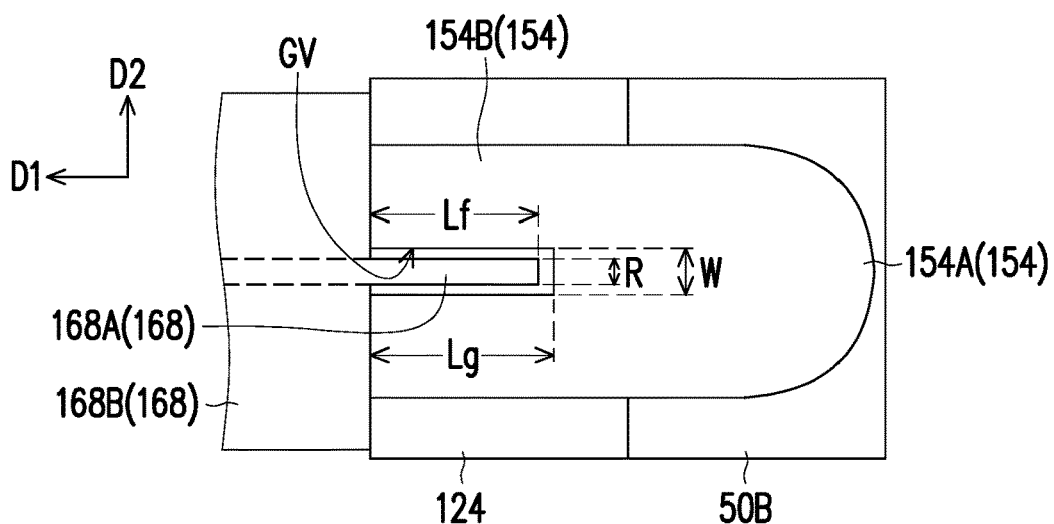
Figure 15C:
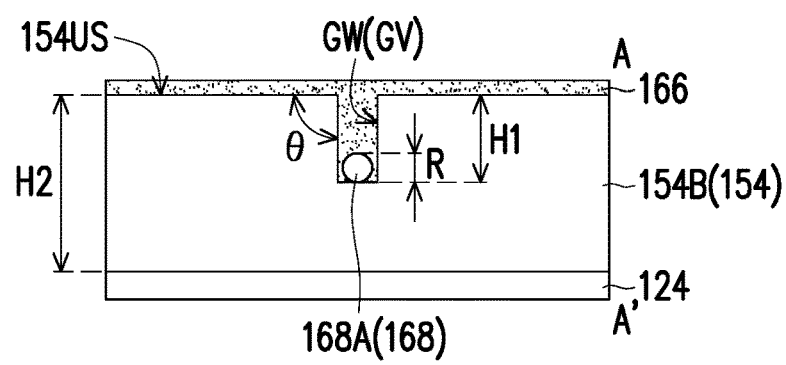
FIG. 15C schematically illustrates a cross-sectional view cutting along a cross-sectional line A-A' illustrated in FIG. 15A in accordance with some embodiments.

In FIG. 13, a fiber 168 (an optical fiber) is physically and optically coupled to the waveguide 154 of the package 101 using an optical adhesive 166. In some embodiments, the package 101 is for connecting with a fiber 168. In some embodiments, the waveguide 154 couples the fiber 168 to the optical coupler 70, such that the light from the fiber 168 may be directed to the optical coupler 70 through the waveguide 154, or vice versa. FIGS. 15A and 15B are schematically cross-sectional and top views of the waveguide 154 and the fiber 168 in FIG. 13. FIG. 15C is a cross-sectional view cutting along a cross-sectional line A-A' illustrated in FIG. 15A. Referring to FIGS. 13 and 15A to 15C, the fiber 168 may comprise a first portion 168A and a second portion 168B, wherein the second portion 168B is connected to the first portion 168A. In some embodiments, the diameter of the first portion 168A of the fiber 168 may be smaller than the second portion 168B of the fiber 168. As an example, the first portion 168A may substantially include the core of the fiber 168, and the second portion 168B may include both the core and the cladding layer of the fiber 168. In other embodiments, the first portion 168A of the fiber 168 may include at least a portion of the cladding layer of the fiber 168.

As previously described in FIG. 9, the first end portion 154A of the waveguide 154 may comprise a reflective region RR on the upper surface 154US. The reflective region RR may be covered by the dielectric layer 128 and is adapted for reflecting the light incident to the region. As such, a light from the fiber 168 may be directed to the optical coupler 70 through the reflective region RR, and vice versa. The upper surface 154US may include an arc-shaped surface in the reflective region RR. The arc-shaped surface in the reflective region RR may facilitate gathering light to the optical coupler 70 and may provide better coupling efficiency. As shown in FIG. 15A, a cross-section of the arc-shaped surface may present an arc-shaped profile. As shown in FIG. 15B, a top view of the arc-shaped surface may present a rounding contour.

In FIGS. 13 and 15A to 15C, the first portion 168A of the fiber 168 is disposed in the groove GV, while the second portion 168B of the fiber 168 is disposed outside the groove GV. In other words, the fiber 168 may be aligned to the waveguide 154 through positioning a portion of the fiber, e.g., the first portion 168A of the fiber 168, into the groove GV. In some embodiments, the groove GV may be set at a position that would provide desirable coupling efficiency when a respective fiber is coupled to the waveguide 154 at the groove GV. In the embodiments where the alignment between a fiber and a waveguide is achieved through the groove on the waveguide, an active alignment process may be omitted, and time consumption and cost of the alignment may be reduced.

In some embodiments, a portion of the optical adhesive 166 is disposed in the groove GV. In some embodiments, the first portion 168A of the fiber 168 is surrounded by the optical adhesive 166. In such embodiment, the first portion 168A of the fiber 168 may be secured to the waveguide 154, and the fiber 168 may be optically coupled to the waveguide 154. In some embodiments, the optical adhesive 166 may fill the groove GV and may be disposed on the upper surface 154US of the waveguide 154 for better coupling efficiency. Further in FIGS. 13 and 15A to 15C, the dielectric layers 128, 132, and 136 of the redistribution structure 122 may be laterally distanced from the fiber 168, and the optical adhesive 166 may be disposed laterally between the fiber 168 and the first dielectric layer 128 of the redistribution structure 122. The optical adhesive 166 may be formed using any suitable material that is light transmissive and through any suitable method. In some embodiments, the optical adhesive 166 may be formed by applying optical gel to the groove GV and then curing the optical gel through any suitable curing process. In some embodiments, the second portion 168B of the fiber 168 leans against the edge 154E of the second end portion 154B of the waveguide 154, such that a more stable connection between the fiber 168 and the waveguide 154 may be achieved. For the purpose of simplicity and clarity, the optical adhesive 166 is omitted in FIG. 15B.

Further in FIGS. 13 and 15A to 15C, the groove GV may have a length Lg along a first direction D1 and a width W along a second direction D2 perpendicular to the first direction D1. The first direction D1 may be parallel to a length direction from the first end portion 154A to the second end portion 154B. In some embodiments, the groove GV may be configured such that the length Lg of the groove GV is substantially equal to or greater than a length Lf of the first portion 168A of the fiber 168, and the width W of the groove GV is substantially equal to or greater than the diameter R of the first portion 168A of the fiber 168. In such embodiments, the groove GV may be capable of accommodating the respective fiber. As shown in FIG. 15C, the groove GV may comprise a substantially vertical sidewall GW. Specifically, an angle θ between a sidewall GW of the groove GV and the upper surface 154US of the waveguide 154 may be substantially equal to 90 degree. Moreover, a depth H1 of the groove GV may be substantially equal to or larger than the diameter R of the first portion 168A of the fiber 168, and a thickness H2 of the second end portion 154B of the waveguide 154 may be substantially equal to or larger than the depth H1 of the groove GV.

Figure 16:
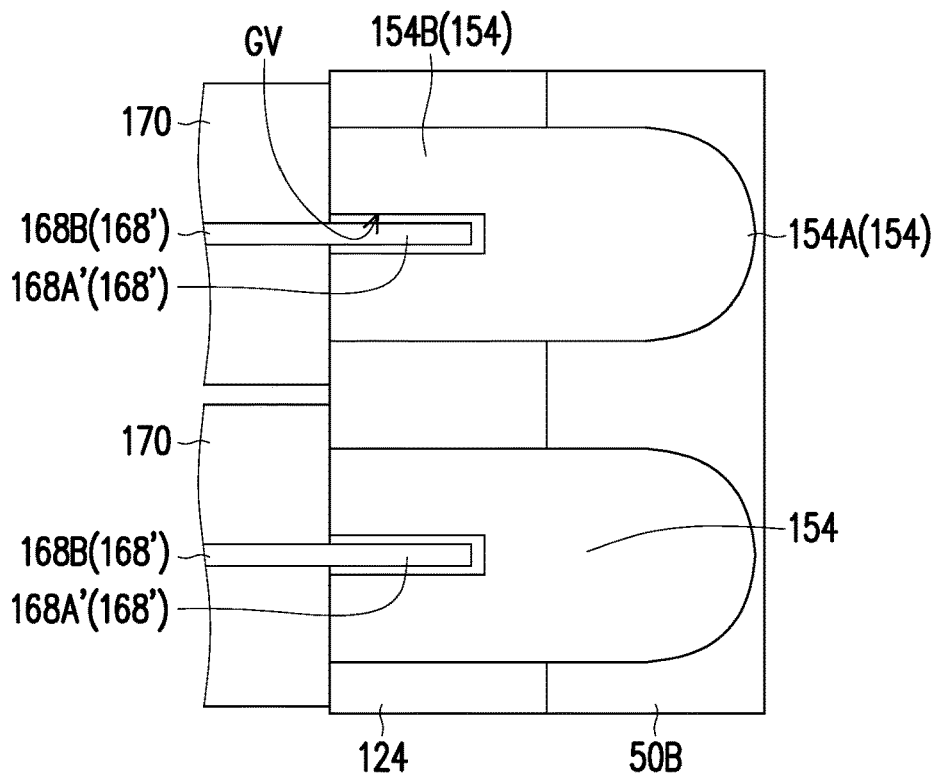
FIG. 16 schematically illustrates a top view of waveguide and fibers in accordance with some embodiments.

FIG. 16 is a schematic top view of waveguides 154 and fibers 168' in accordance with some embodiments. The waveguides 154 and the fibers 168' in FIG. 16 are similar to the waveguide 154 and the fiber 168 illustrated in FIGS. 15A to 15C, with similar features being labeled with similar numerical references, and the description of the similar features in not repeated herein. In FIG. 16, the diameter of the first portion 168A' of the fiber 168' may be substantially equal to second portion 168B of the fiber 168, and the first portion 168A of the fiber 168 may include both the core and the cladding layer of the fiber 168. The second portion 168B of the fiber 168 may be secured by a frame 170. The frame 170 may be disposed outside the groove GV and may lean against the second end portion 154B of the waveguide 154. As shown in FIG. 16, multiple waveguides 154 may be formed over the photonic die 50B for coupling multiple fibers 168 or 168' to the optical coupler 70.

Figure 17:
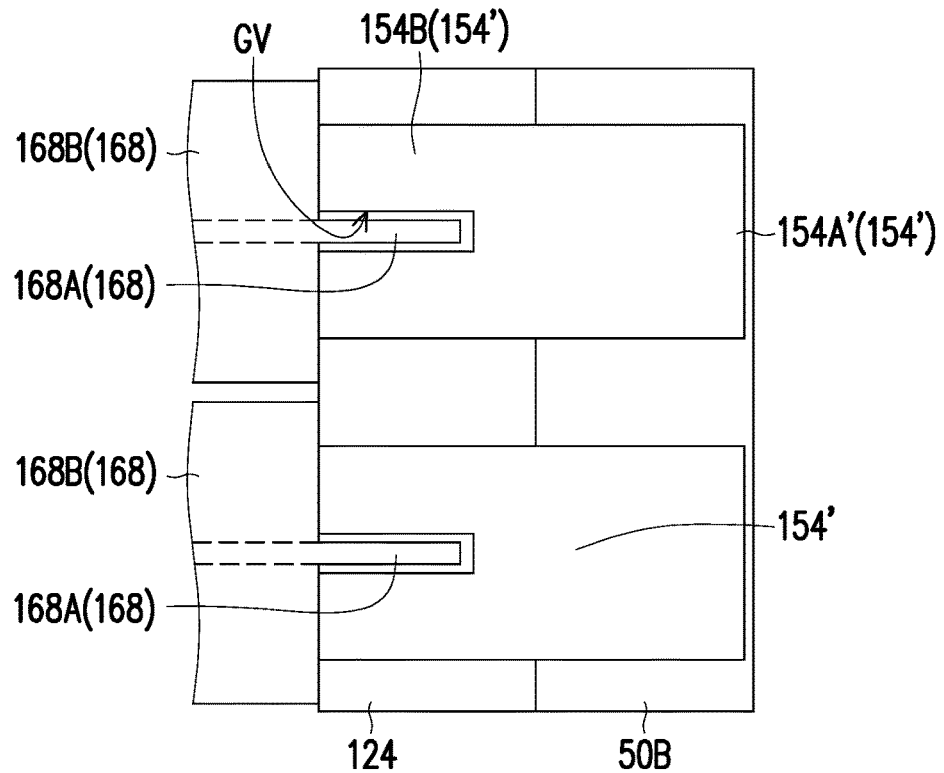
FIG. 17 schematically illustrates a top view of waveguides and fibers in accordance with some embodiments.

FIG. 17 is a schematic top view of waveguides 154' and fibers 168 in accordance with some embodiments. The waveguides 154' and the fibers 168 in FIG. 17 are similar to the waveguide 154 and the fiber 168 illustrated in FIGS. 15A to 15C, with similar features being labeled with similar numerical references, and the description of the similar features in not repeated herein. In FIG. 17, the top view of the first end portion 154A' of the waveguide 154' may present a square-shaped contour, while a cross-section of the first end portion 154A' may present an arc-shaped profile similar to that of the first end portion 154A shown in FIG. 15A.

Figure 18:
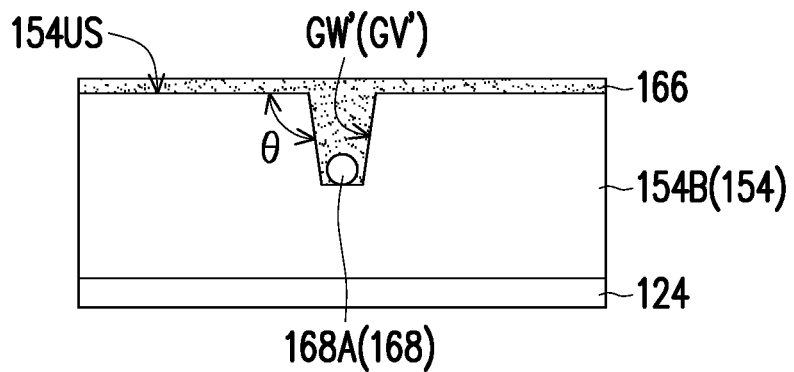
FIGS. 18 and 19 schematically illustrate cross-sectional views of waveguides and fibers in accordance with some embodiments.
Figure 19:
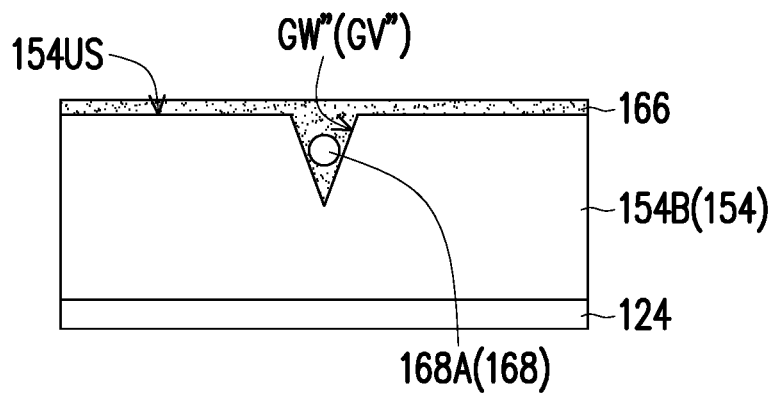

FIGS. 18 and 19 are schematic cross-sectional view of waveguides 154 and fibers 168 in accordance with some embodiments. The waveguide 154 and the fiber 168 in FIGS. 18 and 19 are similar to the waveguide 154 and the fiber 168 illustrated in FIGS. 15A to 15C, with similar features being labeled with similar numerical references, and the description of the similar features in not repeated herein. In FIG. 18, the groove GV' may comprise a tapered sidewall GW'. Specifically, an angle θ between a sidewall GW' of the groove GV' and the upper surface 154US of the waveguide 154 may be substantially equal to or larger than 90 degree. In FIG. 19, the groove GV'' on the upper surface 154US of the waveguide 154 is a V-groove. The groove GV'' may comprise a tapered sidewall GW''', and a cross-section of the groove GV'' may present a V-shaped profile, as shown in FIG. 19. In other embodiments, grooves with various configurations may be adopted. By using polymer as material of the waveguide, it may be easier to form a waveguide with desired structure.

Figure 20A:
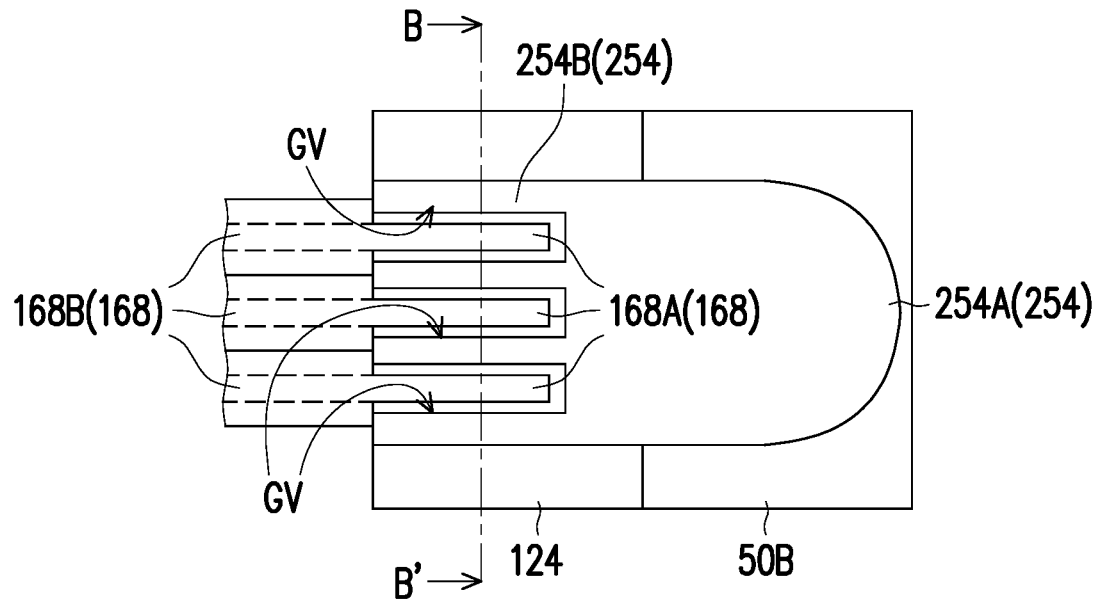
FIGS. 20A and 20B schematically illustrate top and cross-sectional views of a waveguide and fibers in accordance with some embodiments.
Figure 20B:
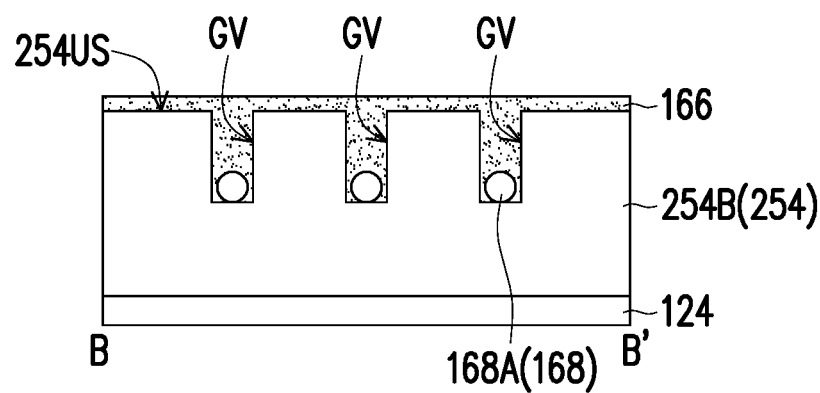

FIG. 20A is a schematic top view of a waveguide 254 and fibers 168 in accordance with some embodiments. FIG. 20B is a cross-sectional view cutting along a cross-sectional line B-B' illustrated in FIG. 20A. The waveguide 254 and the fibers 168 are similar to the waveguide 154 and the fiber 168 illustrated in FIGS. 15A to 15C, with similar features being labeled with similar numerical references, and the description of the similar features in not repeated herein. In some embodiments, the waveguide 254 comprises a first end portion 254A and a second end portion 254B. The first end portion 254A of the waveguide 254 may be similar to the first end portion 154A or 154A' of the waveguide 154. The second end portion 254B of the waveguide 254 may be similar to the second end portion 154B of the waveguide 154, except that the second end portion 254B has a plurality of grooves GV on the upper surface 254US of the waveguide 254 for accommodating and coupling with a plurality of fibers 168. Through coupling multiple fibers to the waveguide, higher signal transmission rate may be achieved.

Figure 21:
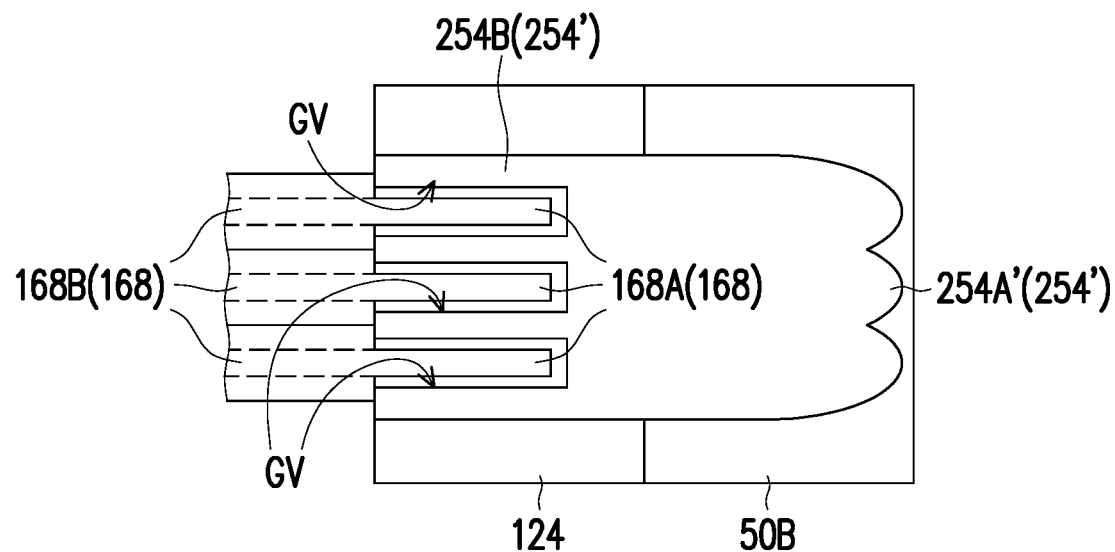
FIG. 21 schematically illustrates a top view of a waveguide and fibers in accordance with some embodiments.

FIG. 21 is a schematic top view of a waveguide 254' and fibers 168 in accordance with some embodiments. The waveguide 254' and the fibers 168 are similar to the waveguide 254 and the fibers 168 illustrated in FIGS. 20A and 20B, with similar features being labeled with similar numerical references, and the description of the similar features in not repeated herein. In FIG. 21, the first end portion 254A' of the waveguide 254 may include multiple arc-shaped surface, each corresponds to one of the fibers 168. As shown in FIG. 21, the top view of the first end portion 254A' may present a contour including multiple curves. In other embodiments, a first end portion with other configurations may be adopted.

Figure 22:
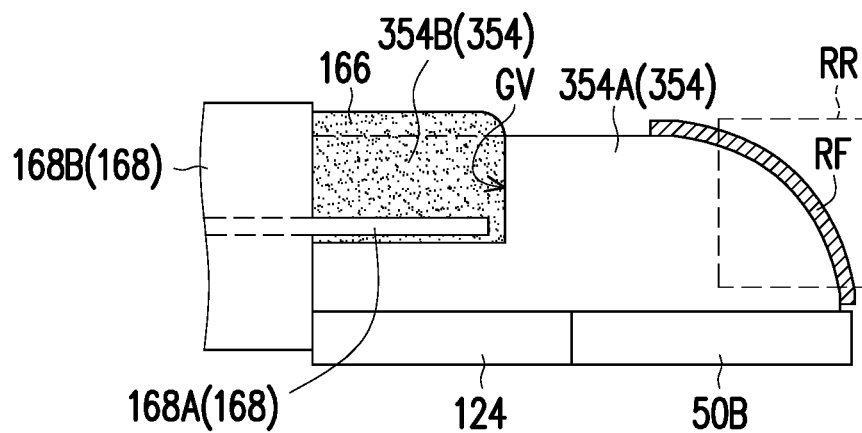
FIG. 22 schematically illustrates a cross-sectional view of a waveguide and a fiber in accordance with some embodiments.

FIG. 22 schematically illustrates a cross-sectional view of a waveguide 354 and a fiber 168 in accordance with some embodiments. The waveguide 354 and the fiber 168 are similar to the waveguide 154 and the fiber 168 illustrated in FIGS. 15A to 15C, with similar features being labeled with similar numerical references, and the description of the similar features in not repeated herein. In FIG. 22, a reflector RF may be disposed on the reflective region RR of the waveguide 354. The reflector RF may comprise a metal, such as copper, titanium, silver, gold, the like, or combinations thereof. The reflector RF may further improve the reflectance of the reflective region RR.

Figure 23A:
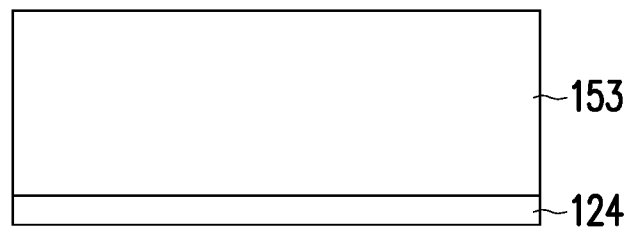
FIGS. 23A to 23C illustrate cross-sectional views of intermediate steps during a process for forming a reflector on a waveguide in accordance with some embodiments.
Figure 23B:
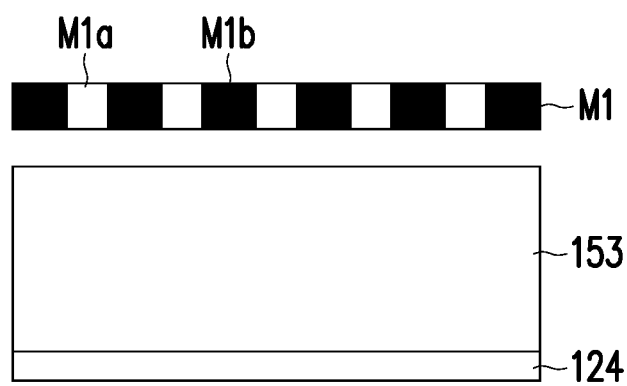
Figure 23C:
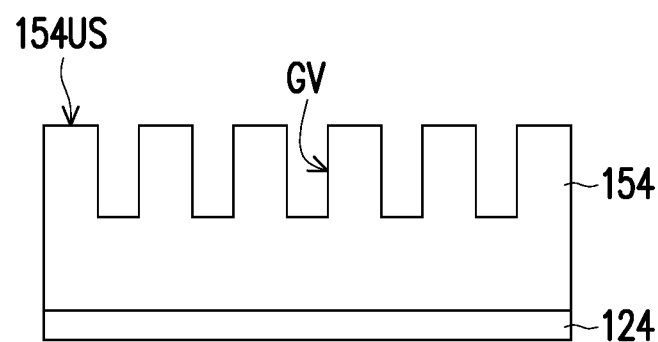

FIGS. 23A to 23C illustrate cross-sectional views of intermediate steps during an exemplified process for forming a waveguide in accordance with some embodiments. In FIG. 23A, a dielectric material layer 153 is formed on the photonic die 50B and the dielectric layer 124. The dielectric material layer 153 may be formed of polyimide, siloxane, epoxy, acrylate, polynorbornene, the like, a combination thereof. The dielectric material layer 153 may be deposited by any suitable method such as spin coating or other methods. In FIG. 23B, a first mask M1 may be used for light exposure. The first mask M1 may include transparent portions M1a allowing light to pass through, and opaque portions M1b blocking at least an amount of the light. A light exposure is then performed, wherein light is projected to expose dielectric material layer 153. In FIG. 23C, the dielectric material layer 153 is developed to remove the unwanted portion thereof to form the desired configuration of the waveguide, for example, as one of the waveguides described above. A curing process may then be performed to form a waveguide 154. Any suitable curing process may be used, and all such processes are fully intended to be included within the scope of the embodiments discussed herein.

FIGS. 24A to 24D illustrate cross-sectional views of intermediate steps during a process for forming a reflector RF on a waveguide in accordance with some embodiments. In FIG. 24A, a waveguide 154 may be formed over the photonic die 50B through, for example, a process shown in FIGS. 23A to 23C. In FIG. 24B, a second mask M2 may be formed, for example, by coating a layer of photoresist onto the waveguide 154 and the photonic die 50B, selectively exposing portions of the photoresist layer to light, and developing the exposed photoresist. The second mask M2 may cover the waveguide 154 and the photonic die 50B except a portion of the first end portion 154A and a portion of the photonic die 50B surrounding the first end portion 154A. In FIG. 24C, a metal layer ML may be formed on the second mask M2 and the portion of the first end portion 154A and the photonic die 50B which are not covered by the second mask M2. In FIG. 24D, the second mask M2 may be removed using, for example, a stripping process or an etching process, and the reflector RF may be formed on the first end portion 154A of the waveguide 154.

Figure 25A:
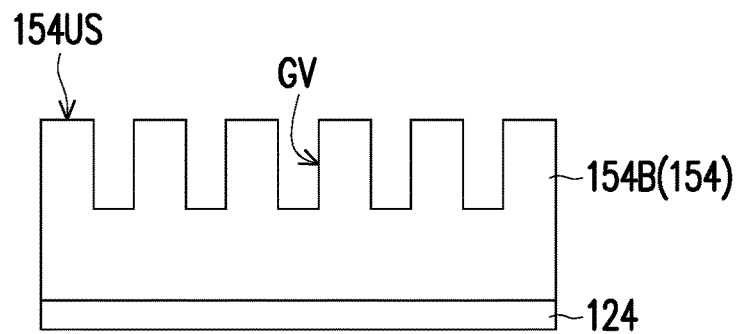
FIGS. 25A to 25C illustrate cross-sectional views of intermediate steps during a process for coupling fibers to a waveguide in accordance with some embodiments.
Figure 25B:
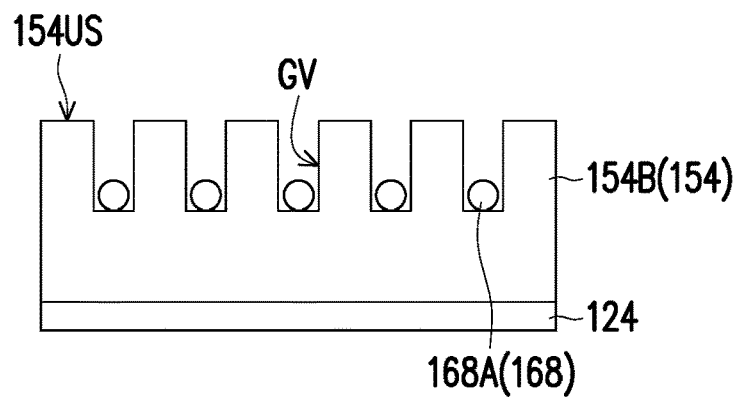
Figure 25C:
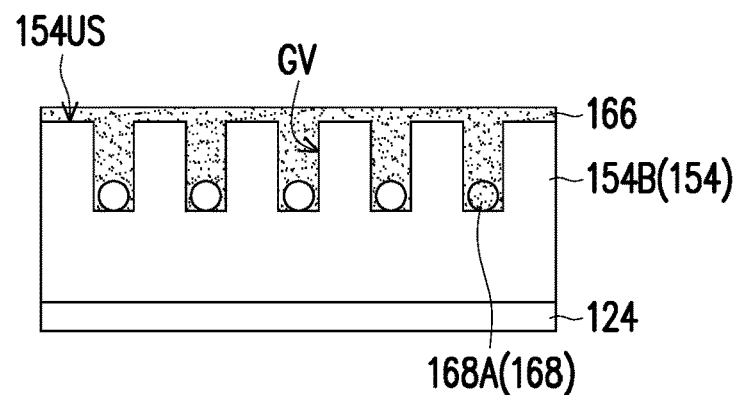

FIGS. 25A to 25C illustrate cross-sectional views of intermediate steps during a process for coupling fibers to a waveguide in accordance with some embodiments. In FIG. 25A, a groove GV or a plurality of grooves GV may be formed on the upper surface 154US at the second end portion 154B of the waveguide 154. In FIG. 25B, a fiber, e.g., a first portion 168A of a fiber 168, may be disposed in a respective groove GV. In FIG. 25C, optical gel may be applied to the grooves GV and surround the first portion 168A of the fiber 168. In some embodiments, the optical gel may be applied on the upper surface 154US of the waveguide 154. The optical gel may then be cured through any suitable curing process to form the optical adhesive 166. A test of the coupling efficiency may be performed after the disposition of the first portion 168A of the fiber 168 into the groove GV and before the application of the optical gel.

Figure 26:
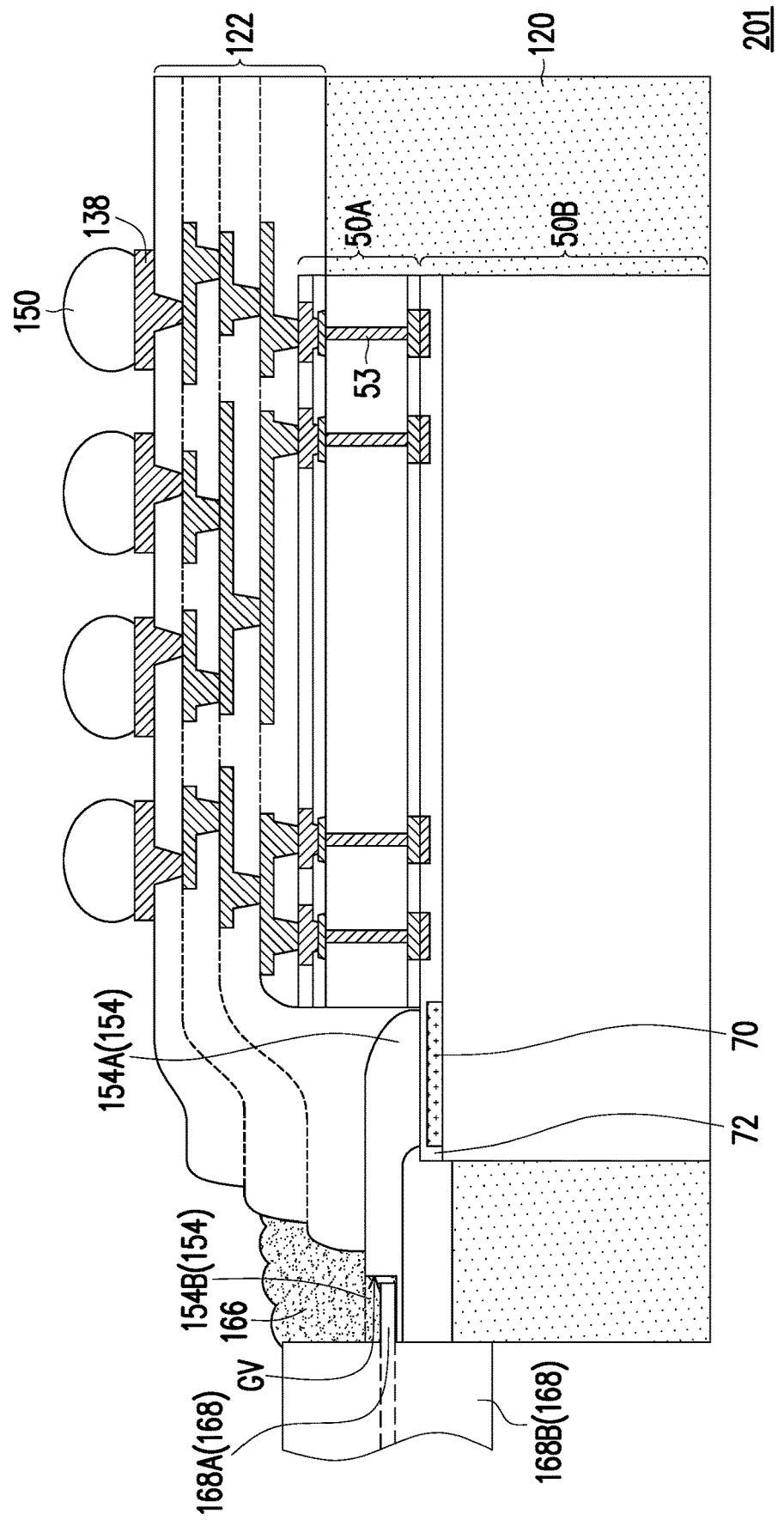
FIG. 26 illustrates a cross-sectional view of a package in accordance with some embodiments.

FIG. 26 is a cross-sectional view of a package in accordance with some embodiments. The package 201 is similar to the package 101 illustrated in FIG. 13, with similar features being labeled with similar numerical references, and the description of the similar features in not repeated herein. In FIG. 26, the electronic die 50A may be vertically-stacked on the photonic die 50B, and the top surface of the photonic die 50B may be hybrid bonded with the bottom surface of the electronic die 50A. In some embodiments, the electronic die 50A may include TSVs 53, such that the photonic die 50B may be electrically coupled to the electronic die 50A and the redistribution structure 122 through the TSVs 53.

Figure 27:
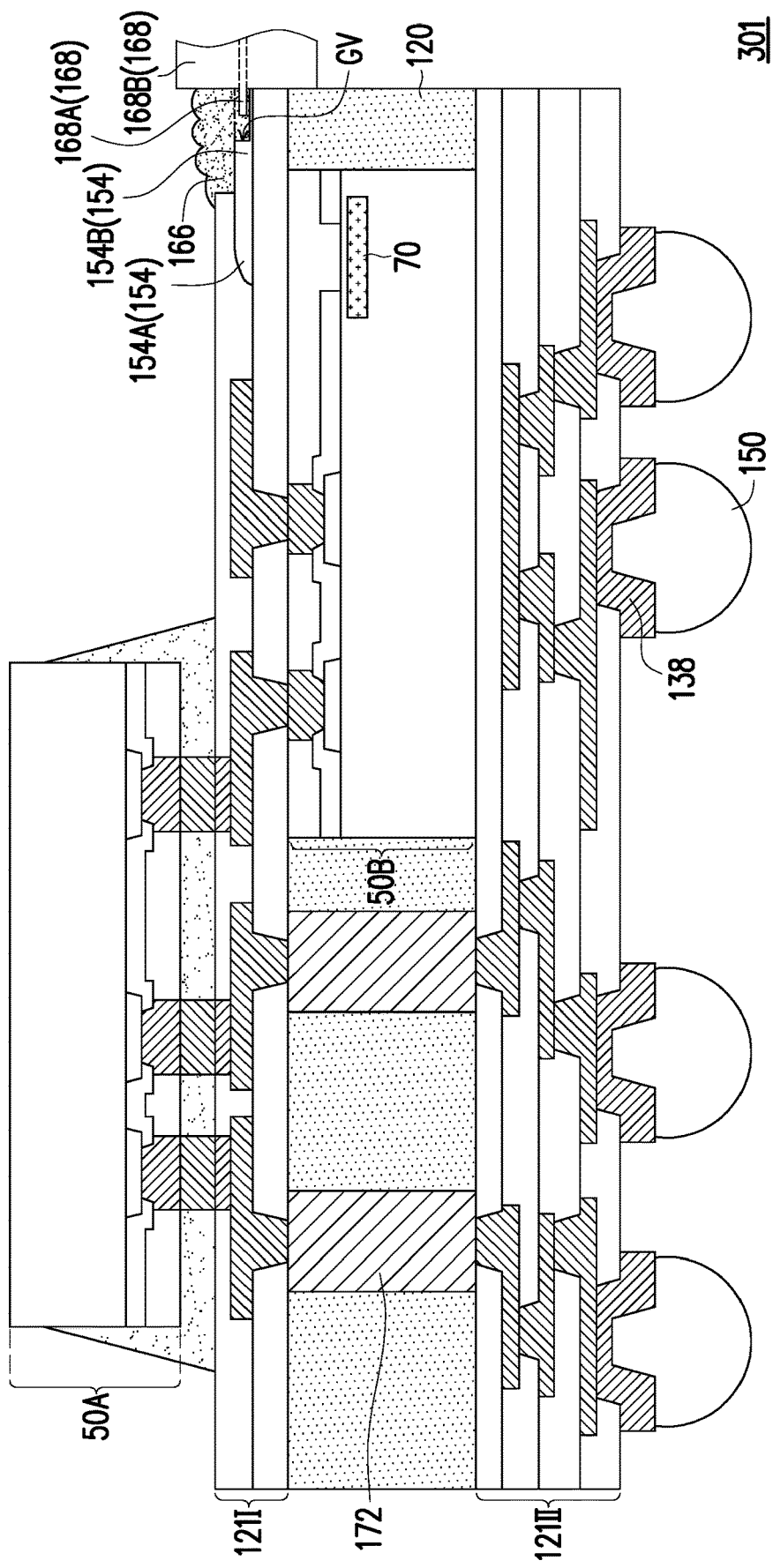
FIG. 27 illustrates a cross-sectional view of a package in accordance with some embodiments.

FIG. 27 illustrates a cross-sectional view of a package in accordance with some embodiments. The package 301 is similar to the package 101 illustrated in FIG. 13, with similar features being labeled with similar numerical references, and the description of the similar features in not repeated herein. In FIG. 27, a first redistribution structure 1221 is disposed over the encapsulant 120, the photonic die 50B, and the waveguide 154. The electronic die 50A may be flip chip bonded to the first redistribution structure 1221, and an underfill may be disposed between the electronic die 50A and the first redistribution structure 1221. Specifically, in FIG. 27, the redistribution structure 1221 is electrically and physically connected to the electronic die 50A and the photonic die 50B on opposite sides. In some embodiments, the package 301 may further include a second redistribution structure 12211 physically connected to the bottom surface of the photonic die 50B. The package 301 may further include through molding vias (TMV) 172 extending between the first redistribution structure 1221 and the second redistribution structure 12211, and the first redistribution structure 1221 may be electrically connected with the second redistribution structure 12211 by way of the TMVs 172. The encapsulant 120 may laterally encapsulate the photonic die 50B and TMVs 172. In FIG. 27, UBMs 138 and conductive connectors 150 may be disposed on the second redistribution structure 12211 for external connection to the second redistribution structure 12211.

Figure 28:
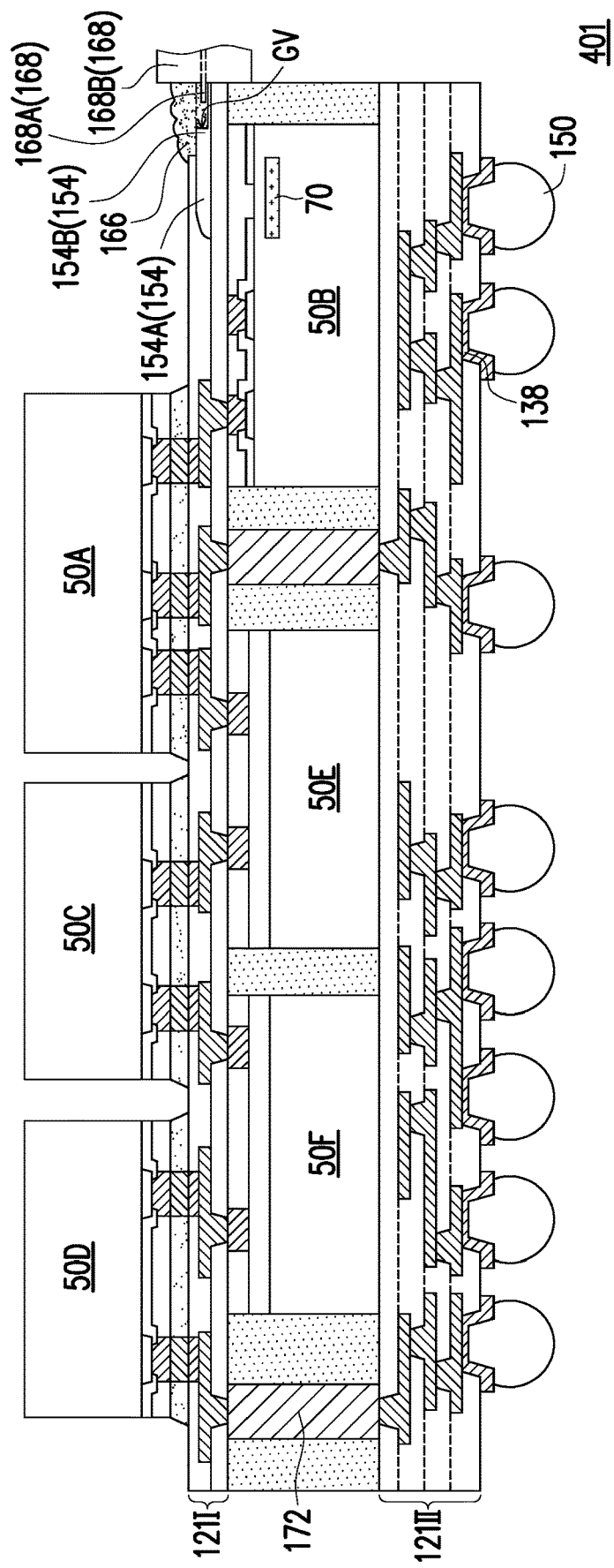
FIG. 28 illustrates a cross-sectional view of a package in accordance with some embodiments.

FIG. 28 illustrates a cross-sectional view of a package in accordance with some embodiments. The package 401 is similar to the package 301 illustrated in FIG. 27, with similar features being labeled with similar numerical references, and the description of the similar features in not repeated herein. In FIG. 28, the package 401 may further include electronic dies 50C, 50D, 50E and 50F. The electronic dies 50A, 50C, and 50D are laterally arranged on the first redistribution structure 1221, and an underfill may be disposed between each of the electronic dies 50A, 50C, and 50D and the first redistribution structure 1221. The photonic die 50B and the electronic dies 50E and 50F are laterally arranged, and the encapsulant 120 laterally encapsulates the photonic die 50B, the electronic dies 50E and 50F, and the TMVs 172.

In the present disclosure, a waveguide is configured such that the second end portion of the waveguide have at least one groove on the upper surface. The groove may be adapted for accommodating at least a portion of the fiber. The fiber may be aligned to the waveguide through positioning a portion of the fiber into the groove. In the embodiments where the alignment between a fiber and a waveguide is achieved through the groove on the waveguide, an active alignment process may be omitted, and time consumption and cost of the alignment may be reduced.

In an embodiment, a package structure including a photonic, an electronic die, an encapsulant and a waveguide is provided. The photonic die includes an optical coupler. The electronic die is electrically coupled to the photonic die. The encapsulant laterally encapsulates the photonic die and the electronic die. The waveguide is disposed over the encapsulant and includes an upper surface facing away from the encapsulant. The waveguide includes a first end portion and a second end portion, the first end portion is optically coupled to the optical coupler, and the second end portion has a groove on the upper surface. In some embodiments, the package structure further includes a fiber, wherein a first portion of the fiber is disposed in the groove. In some embodiments, a width of the groove is substantially equal to or greater than a diameter of the first portion of the fiber. In some embodiments, a length of the groove is substantially equal to or greater than a length of the first portion of the fiber. In some embodiments, a second portion of the fiber connected to the first portion of the fiber is disposed outside the groove and leans against an edge of the second end portion of the waveguide. In some embodiments, the package structure further includes an optical adhesive, wherein the fiber is surrounded by the optical adhesive. In some embodiments, the package structure further includes a redistribution structure disposed over and electrically coupled to the photonic die and the electronic die, wherein a first dielectric layer of the redistribution structure is laterally distanced from the fiber. In some embodiments, the package structure further includes an optical adhesive, wherein the optical adhesive is disposed laterally between the fiber and the first dielectric layer of the redistribution structure. In some embodiments, a top surface of the photonic die is disposed between the upper surface of the waveguide and a bottom surface of the photonic die. In some embodiments, an angle between a sidewall of the groove and the upper surface of the waveguide is substantially equal to or larger than 90 degree.

In an embodiment, a package structure is provided for connecting with a fiber. The package structure includes a photonic die, an encapsulant, and a waveguide. The photonic die includes an optical coupler. The encapsulant laterally encapsulates the photonic die. The waveguide is disposed over the encapsulant and includes an upper surface facing away from the encapsulant. The waveguide includes a first end portion and a second end portion, the first end portion includes a reflective region on the upper surface, and the second end portion has a groove for accommodating the fiber. In some embodiments, the package structure further includes a base dielectric layer disposed between the waveguide and the encapsulant. In some embodiments, the reflective region includes an arc-shaped surface. In some embodiments, the package structure further includes a reflector disposed on the reflective region of the waveguide. In some embodiments, the package structure further includes a redistribution structure disposed over and electrically coupled to the photonic die, wherein a first dielectric layer of the redistribution structure is disposed on the waveguide, and is distanced from an edge of the second end portion of the waveguide. In some embodiments, wherein an edge of the second end portion of the waveguide is vertically aligned with a sidewall of the encapsulant.

In an embodiment, a package structure is provided for connecting with a fiber. The package structure includes a photonic die, an electronic die, and a waveguide. The photonic die includes an optical coupler and an insulating layer disposed over the optical coupler. The electronic die electrically is coupled to the photonic die. The waveguide includes a first end portion and a second end portion. The first end portion is disposed on the insulating layer and optically coupled to the optical coupler, and the second end portion extends away from the first end portion and has a groove for accommodating the fiber. In some embodiments, the package structure further includes a redistribution structure electrically coupled to the photonic die and the electronic die, wherein a first dielectric layer of the redistribution structure is disposed on the waveguide, and a portion of the groove is uncovered by the first dielectric layer of the redistribution structure. In some embodiments, the package structure further includes an optical adhesive, wherein a portion of the optical adhesive is disposed in the groove. In some embodiments, the groove includes a tapered or vertical sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
   a photonic die comprising an optical coupler;
   an electronic die electrically coupled to the photonic die;
   an encapsulant laterally encapsulating the photonic die and the electronic die; and
   a waveguide disposed over the encapsulant and comprising an upper surface facing away from the encapsulant, wherein the waveguide comprises a first end portion and a second end portion, the first end portion is optically coupled to the optical coupler, and the second end portion has a groove on the upper surface.

2. The package structure of claim 1 further comprising a fiber, wherein a first portion of the fiber is disposed in the groove.

3. The package structure of claim 2, wherein a width of the groove is substantially equal to or greater than a diameter of the first portion of the fiber.

4. The package structure of claim 2, wherein a length of the groove is substantially equal to or greater than a length of the first portion of the fiber.

5. The package structure of claim 2, wherein a second portion of the fiber connected to the first portion of the fiber is disposed outside the groove and leans against an edge of the second end portion of the waveguide.

6. The package structure of claim 2 further comprising an optical adhesive, wherein the fiber is surrounded by the optical adhesive.

7. The package structure of claim 2 further comprising a redistribution structure disposed over and electrically coupled to the photonic die and the electronic die, wherein a first dielectric layer of the redistribution structure is laterally distanced from the fiber.

8. The package structure of claim 7 further comprising an optical adhesive, wherein the optical adhesive is disposed laterally between the fiber and the first dielectric layer of the redistribution structure.

9. The package structure of claim 1, wherein a top surface of the photonic die is disposed between the upper surface of the waveguide and a bottom surface of the photonic die.

10. The package structure of claim 1, wherein an angle between a sidewall of the groove and the upper surface of the waveguide is substantially equal to or larger than 90 degree.

11. A package structure for connecting with a fiber, the package structure comprising:
- a photonic die comprising an optical coupler and an insulating layer disposed over the optical coupler;
- an electronic die electrically coupled to the photonic die; and
- a waveguide comprising a first end portion and a second end portion, wherein the first end portion is disposed on the insulating layer and optically coupled to the optical coupler, and the second end portion extends away from the first end portion and has a groove for accommodating the fiber.

12. The package structure of claim 11 further comprising a redistribution structure electrically coupled to the photonic die and the electronic die, wherein a first dielectric layer of the redistribution structure is disposed on the waveguide, and a portion of the groove is uncovered by the first dielectric layer of the redistribution structure.

13. The package structure of claim 11 further comprising an optical adhesive, wherein a portion of the optical adhesive is disposed in the groove.

14. The package structure of claim 11, wherein the groove comprises a tapered or vertical sidewall.

15. A package structure for connecting with a fiber, the package structure comprising:
- a photonic die comprising an optical coupler;
- an electronic die electrically coupled to the photonic die;
- an encapsulant laterally encapsulating the photonic die and the electronic die; and
- a waveguide disposed over the encapsulant, wherein the waveguide comprises a first end portion and a second end portion, the first end portion comprises a reflective region disposed on an optical path between the fiber and the optical coupler, and the second end portion comprises a groove for accommodating the fiber.

16. The package structure of claim 15 further comprising a base dielectric layer disposed between the waveguide and the encapsulant.

17. The package structure of claim 15, wherein the reflective region comprises an arc-shaped surface.

18. The package structure of claim 15 further comprising a reflector disposed on the reflective region of the waveguide.

19. The package structure of claim 15 further comprising a redistribution structure disposed over and electrically coupled to the photonic die and the electronic die, wherein a first dielectric layer of the redistribution structure is disposed on the waveguide, and is distanced from an edge of the second end portion of the waveguide.

20. The package structure of claim 15, wherein an edge of the second end portion of the waveguide is vertically aligned with a sidewall of the encapsulant.

* * * * *